(12) United States Patent
Chang et al.

(10) Patent No.: US 11,114,405 B2
(45) Date of Patent: Sep. 7, 2021

(54) SEMICONDUCTOR PACKAGE STRUCTURE WITH TWINNED COPPER

(71) Applicant: TAIWAN SEMICONDUCTOR MANUFACTURING CO., LTD., Hsinchu (TW)

(72) Inventors: Jung-Hua Chang, Hsinchu (TW); Po-Hao Tsai, Taoyuan (TW); Jing-Cheng Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/725,190

(22) Filed: Dec. 23, 2019

(65) Prior Publication Data

US 2020/0135680 A1   Apr. 30, 2020

Related U.S. Application Data

(62) Division of application No. 15/609,523, filed on May 31, 2017, now Pat. No. 10,515,923.

(51) Int. Cl.
*H01L 21/02* (2006.01)
*H01L 23/00* (2006.01)
(Continued)

(52) U.S. Cl.
CPC ........ *H01L 24/27* (2013.01); *H01L 21/02603* (2013.01); *H01L 21/486* (2013.01); *H01L 21/4846* (2013.01); *H01L 21/4853* (2013.01); *H01L 21/568* (2013.01); *H01L 21/6835* (2013.01); *H01L 23/3107* (2013.01); *H01L 23/3128* (2013.01); *H01L 23/49866* (2013.01); *H01L 24/02* (2013.01); *H01L 24/24* (2013.01); *H01L 24/25* (2013.01); *H01L 24/30* (2013.01); *H01L 21/563* (2013.01); *H01L 21/6836* (2013.01); *H01L 23/49816* (2013.01);
(Continued)

(58) Field of Classification Search
CPC ..... H01L 2924/01029; H01L 21/02603; Y10S 977/762
See application file for complete search history.

(56) References Cited

U.S. PATENT DOCUMENTS

| 5,972,192 A | 10/1999 | Dubin et al. |
| 8,957,323 B2 * | 2/2015 | Chen ............... H05K 3/40 174/261 |

(Continued)

*Primary Examiner* — Allen L Parker
*Assistant Examiner* — Gustavo G Ramallo
(74) *Attorney, Agent, or Firm* — Birch, Stewart, Kolasch & Birch, LLP

(57) ABSTRACT

A semiconductor package structure is provided. The semiconductor package structure includes a chip structure. The semiconductor package structure includes a first conductive structure over the chip structure. The first conductive structure is electrically connected to the chip structure. The first conductive structure includes a first transition layer over the chip structure; a first conductive layer on the first transition layer; and a second conductive layer over the first conductive layer. The first conductive layer is substantially made of twinned copper. A first average roughness of a first top surface of the second conductive layer is less than a second average roughness of a second top surface of the first conductive layer.

20 Claims, 26 Drawing Sheets

(51) Int. Cl.
  *H01L 23/31* (2006.01)
  *H01L 21/48* (2006.01)
  *H01L 21/683* (2006.01)
  *H01L 21/56* (2006.01)
  *H01L 23/498* (2006.01)
  *H01L 23/538* (2006.01)

(52) U.S. Cl.
  CPC .... *H01L 23/49822* (2013.01); *H01L 23/5389* (2013.01); *H01L 2221/68331* (2013.01); *H01L 2221/68345* (2013.01); *H01L 2221/68359* (2013.01); *H01L 2221/68372* (2013.01); *H01L 2224/27462* (2013.01); *H01L 2224/3003* (2013.01); *H01L 2224/3012* (2013.01); *H01L 2924/01029* (2013.01); *Y10S 977/762* (2013.01)

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,773,741 B1 | 9/2017 | Gu et al. |
| 9,994,967 B2 | 6/2018 | Chen et al. |
| 2004/0108217 A1 | 6/2004 | Dubin |
| 2007/0148949 A1* | 6/2007 | Suh .......... H01L 24/13 438/612 |
| 2012/0135260 A1* | 5/2012 | Jang .......... C25D 5/48 428/546 |
| 2012/0171814 A1 | 7/2012 | Choi et al. |
| 2014/0090880 A1* | 4/2014 | Chen ........ H01L 23/49811 174/257 |
| 2014/0103501 A1 | 4/2014 | Chen et al. |
| 2015/0291416 A1* | 10/2015 | Liang .......... B81B 7/0038 257/415 |
| 2016/0071831 A1 | 3/2016 | Lee et al. |
| 2017/0317058 A1 | 11/2017 | Chen et al. |

* cited by examiner

SEMICONDUCTOR PACKAGE STRUCTURE WITH TWINNED COPPER

CROSS REFERENCE

This application is a Divisional of U.S. application Ser. No. 15/609,523, filed on May 31, 2017, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (e.g., the number of interconnected devices per chip area) has generally increased while geometric size (e.g., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1I-2 is an enlarged figure of region A in FIG. 1I, in accordance with some embodiments.

FIG. 1J-1 is an enlarged figure of region B in FIG. 1J, in accordance with some embodiments.

FIG. 1J-2 is a top-view of the conductive lines and portions of the dielectric layer and the chip structure in FIG. 1J, in accordance with some embodiments.

FIG. 2 is a cross-sectional view of a semiconductor package structure, in accordance with some embodiments.

DETAILED DESCRIPTION

Figure 1A:
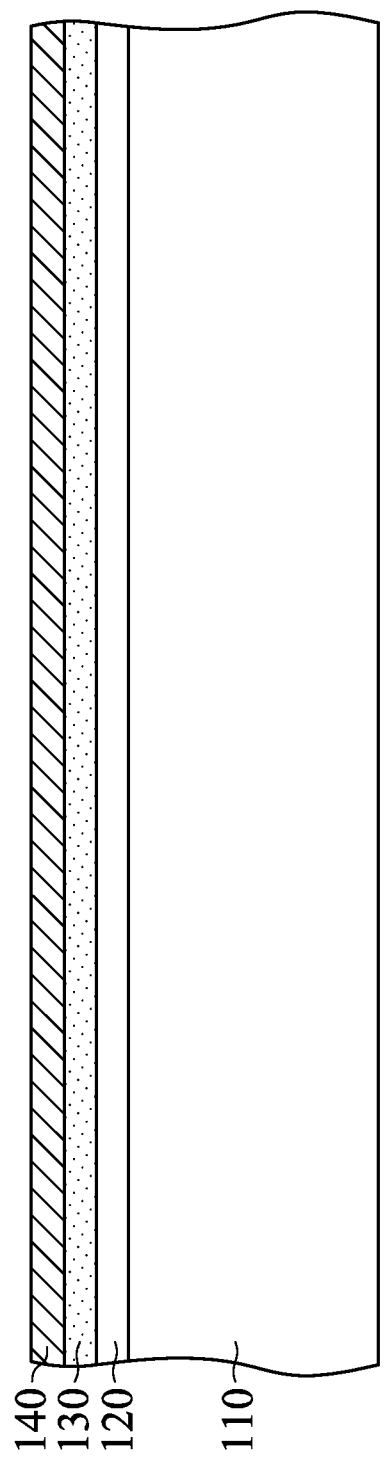
FIGS. 1A-1P are cross-sectional views of various stages of a process for forming a semiconductor package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
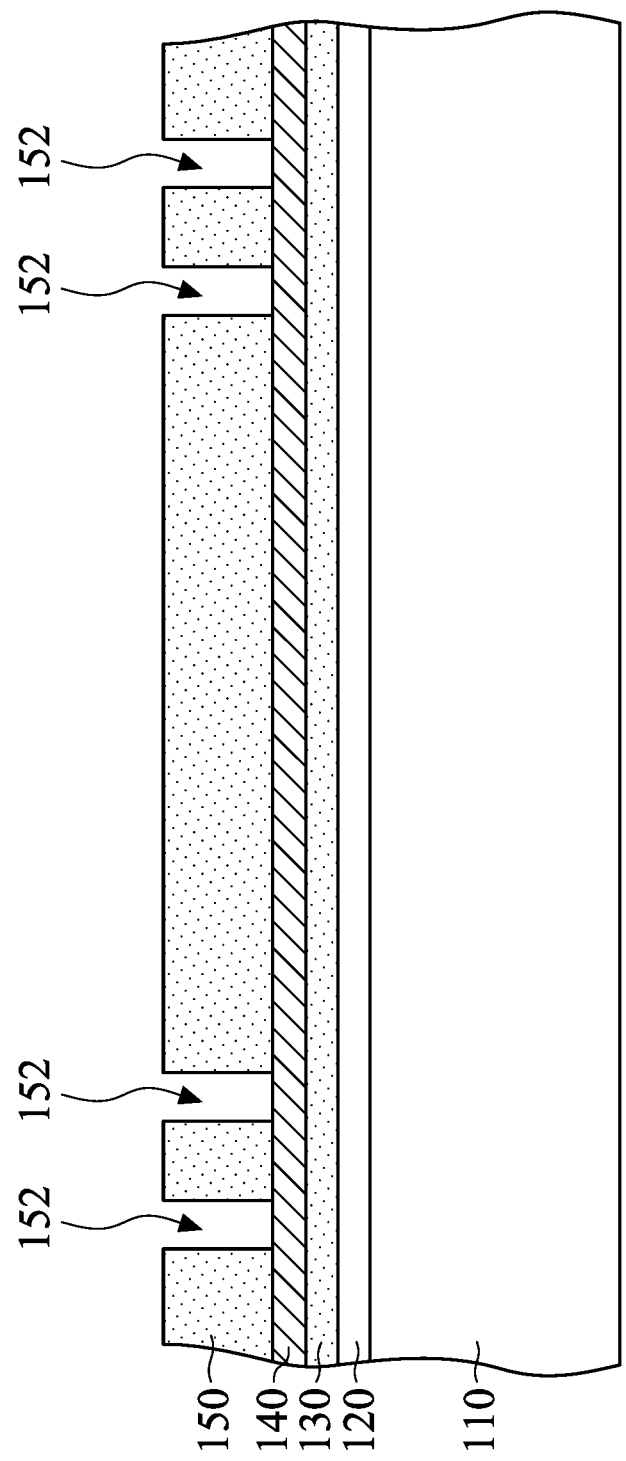
Figure 1C:
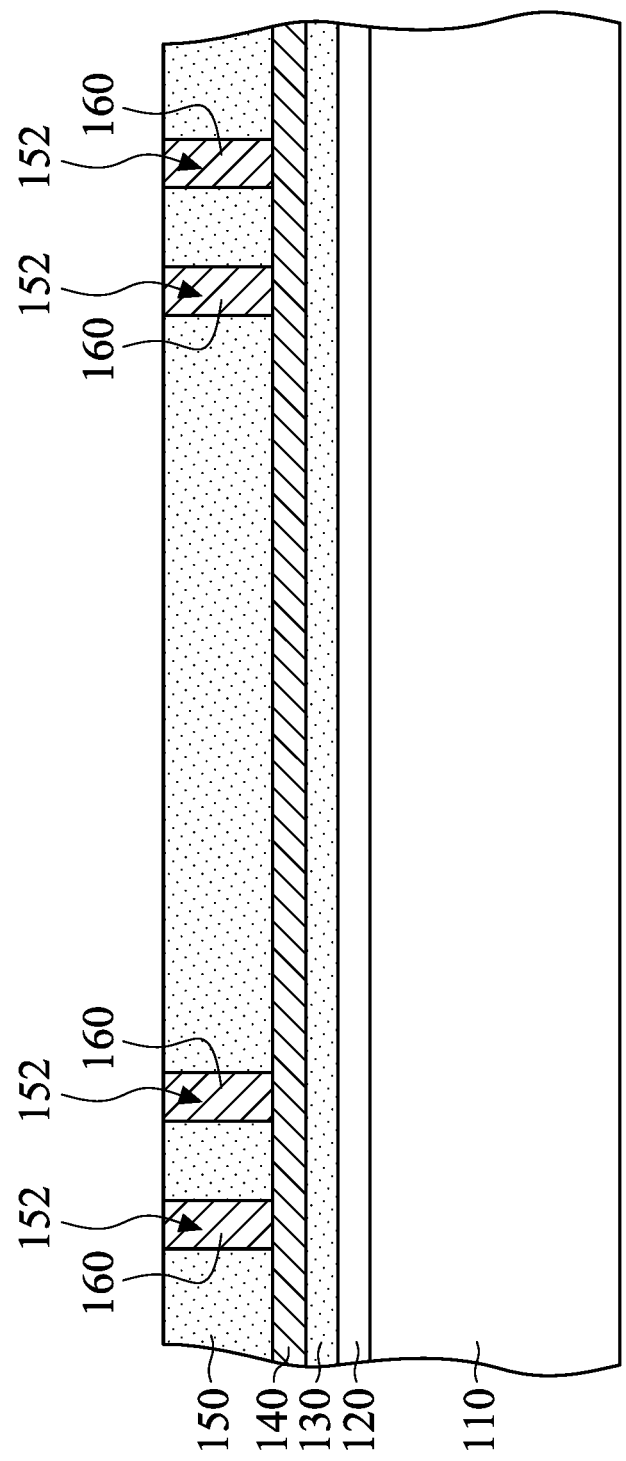
Figure 1D:
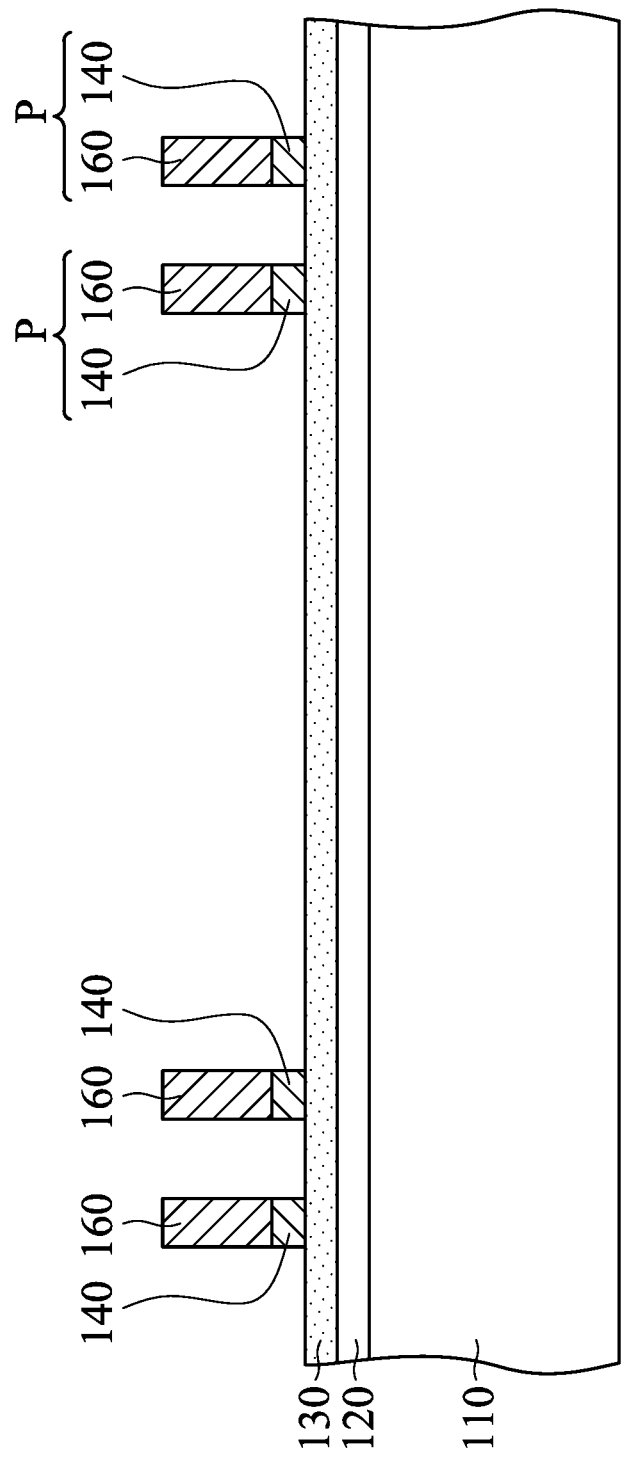
Figure 1E:
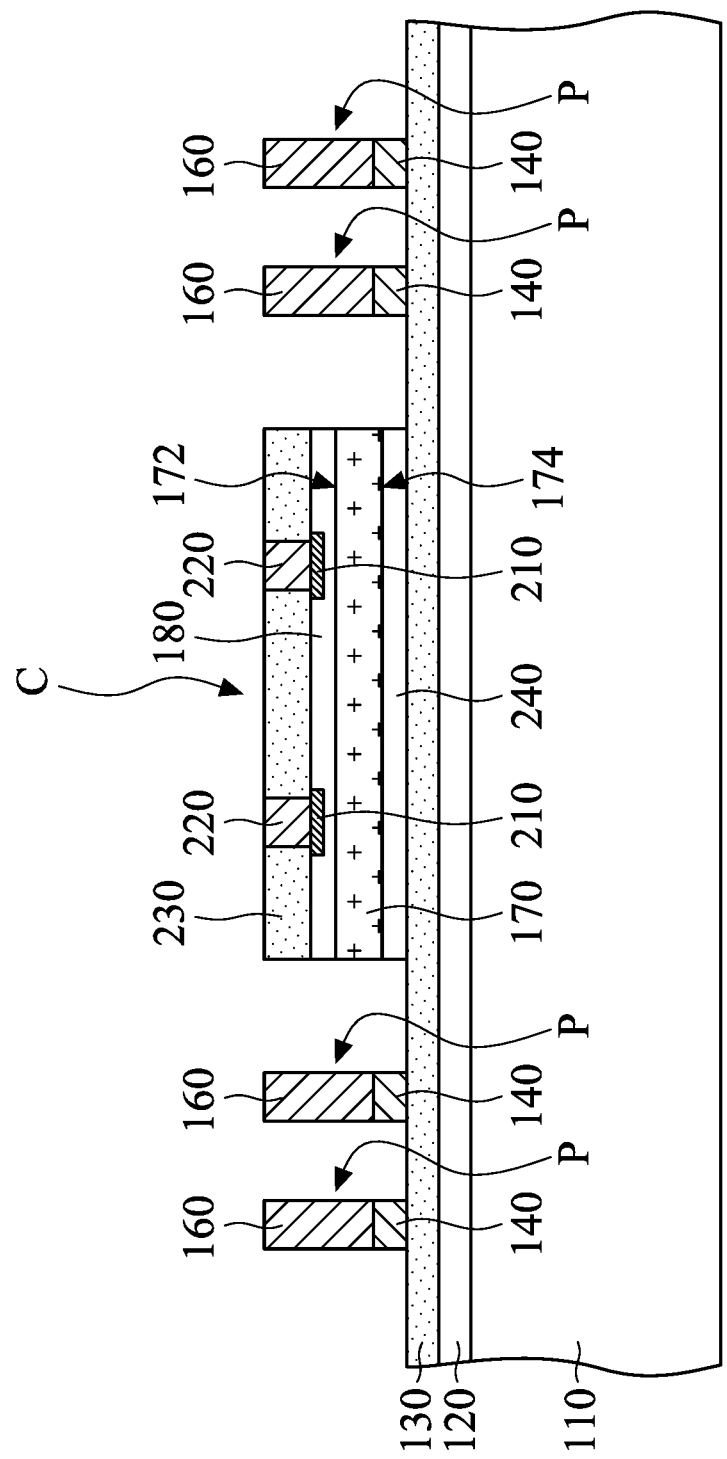
Figure 1F:
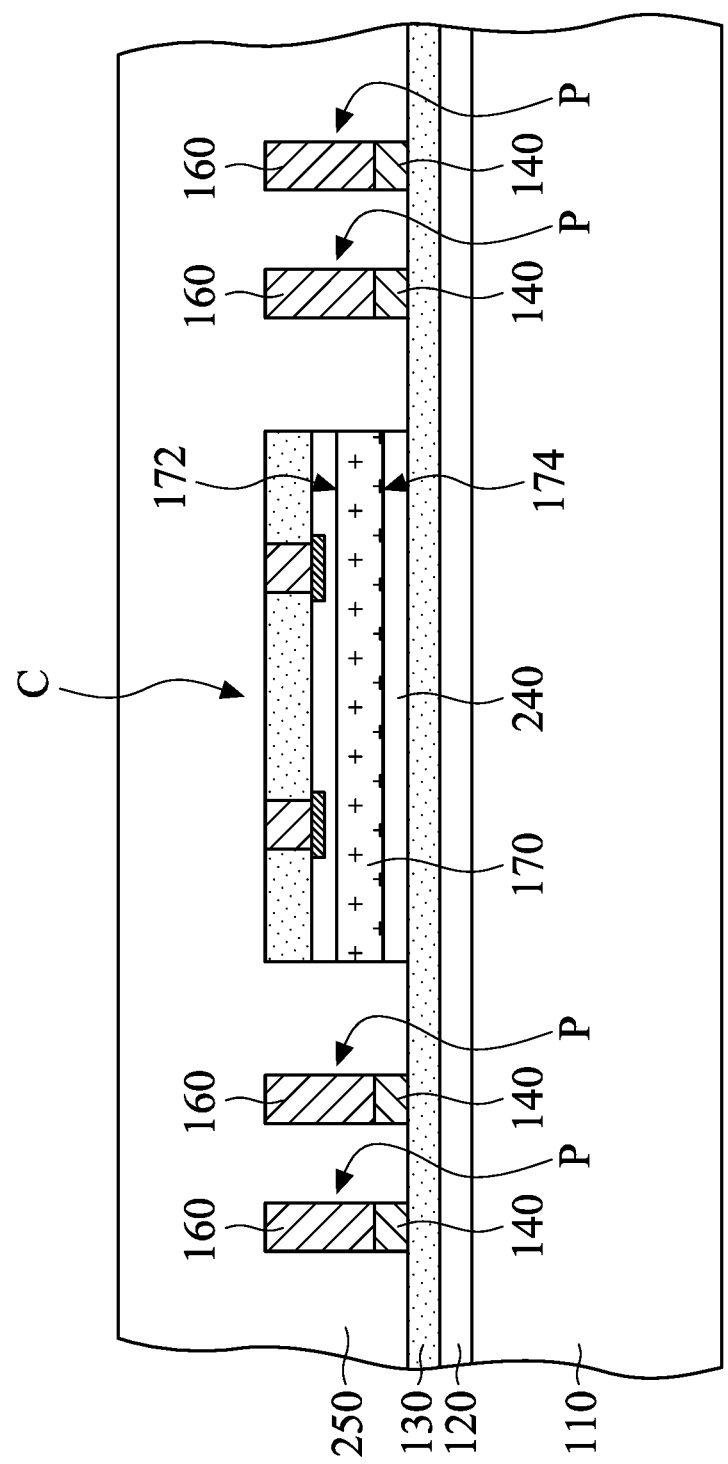
Figure 1G:
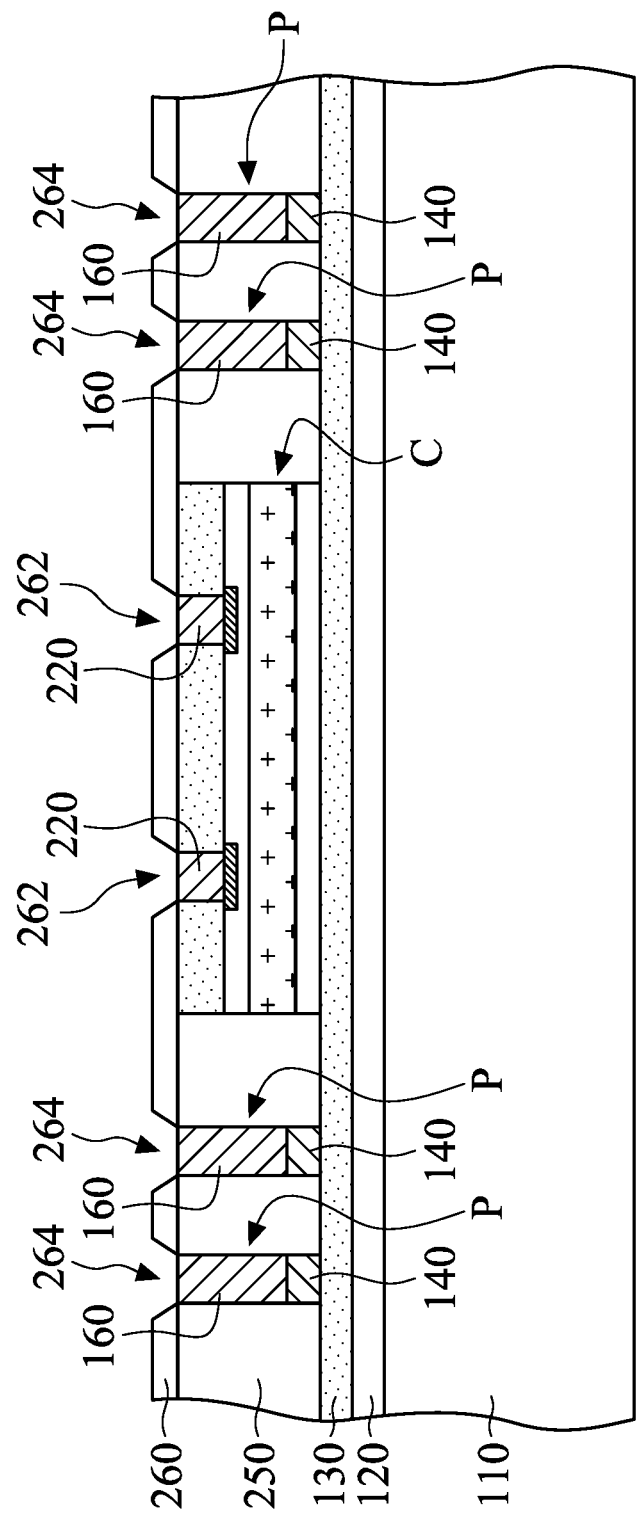
Figure 1H:
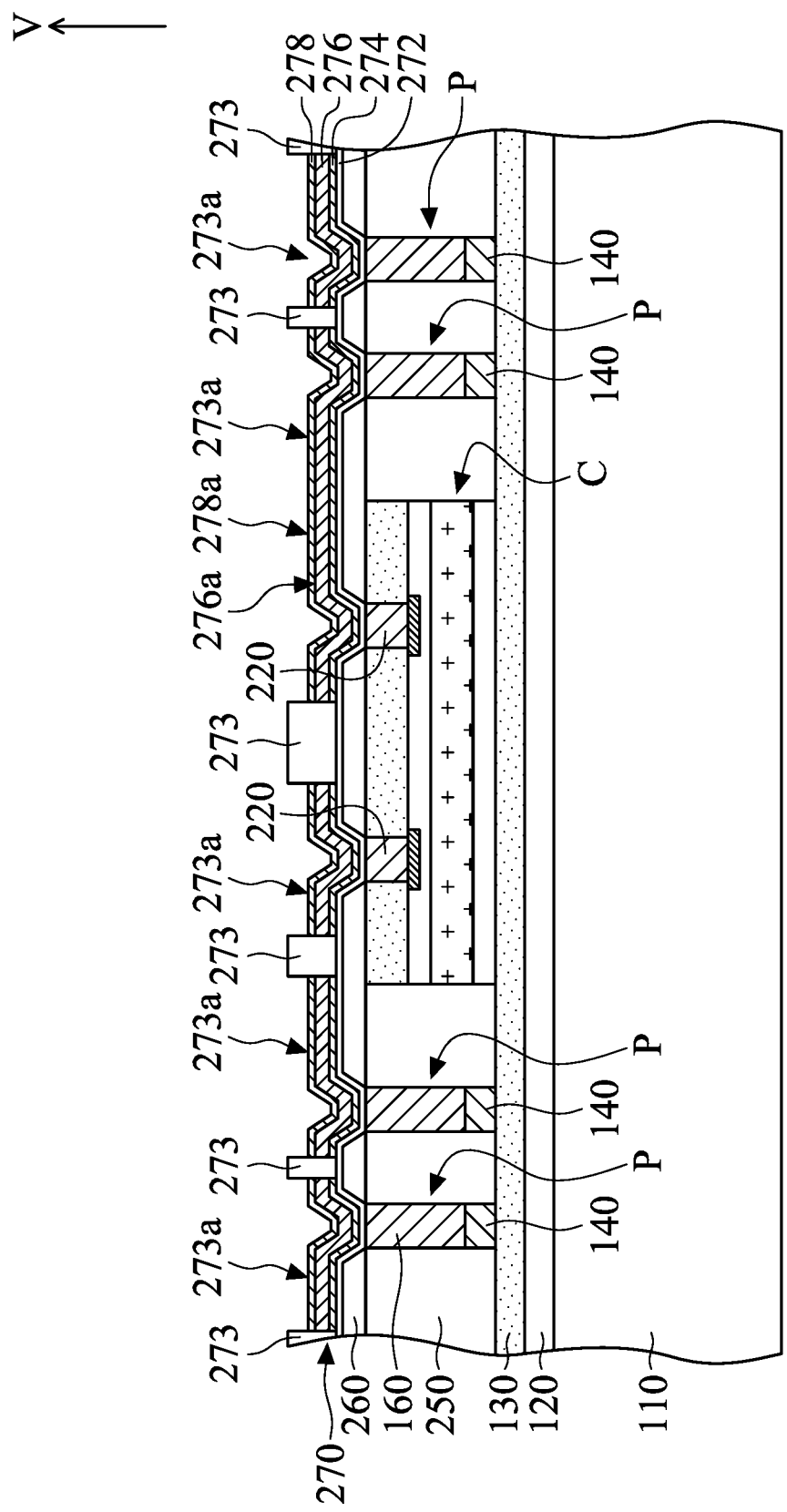
Figure 1I:
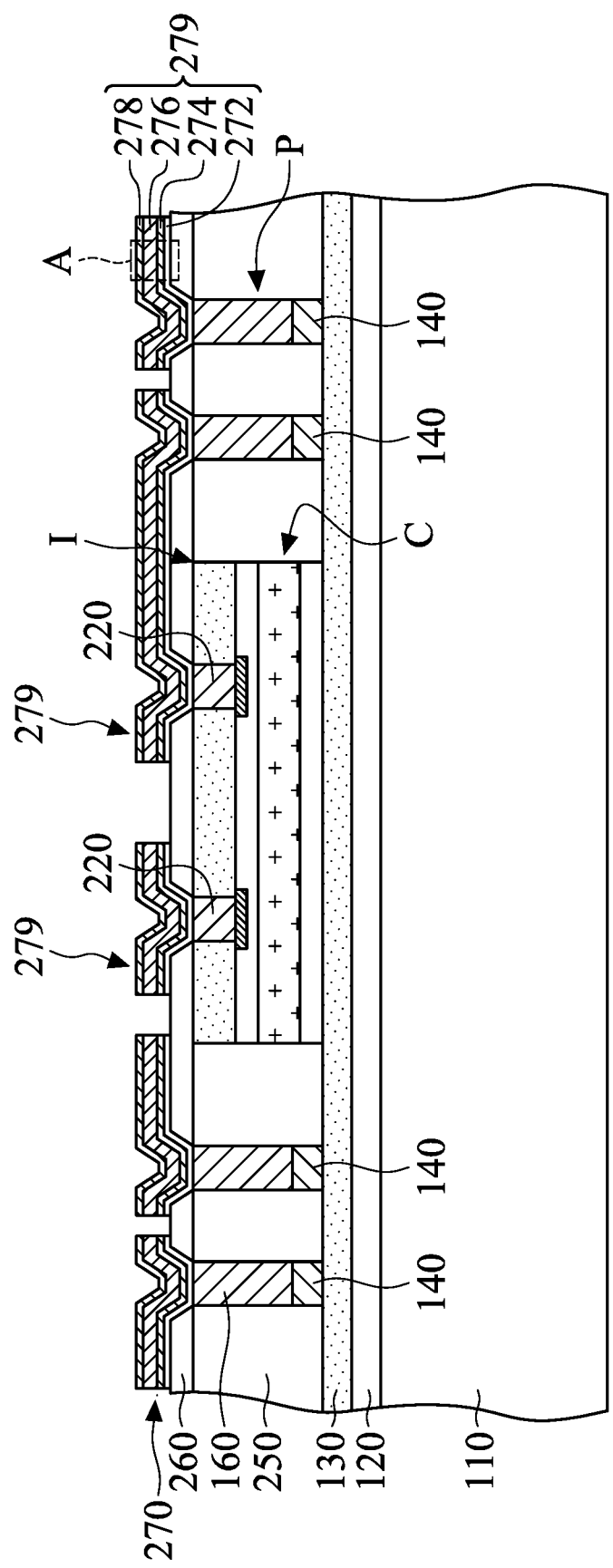
FIG. 1I-1 is a top-view of two of the conductive lines, a corner portion of the chip structure, and portions of the dielectric layer and the molding layer in FIG. 1I, in accordance with some embodiments.
Figures 1, 1I:
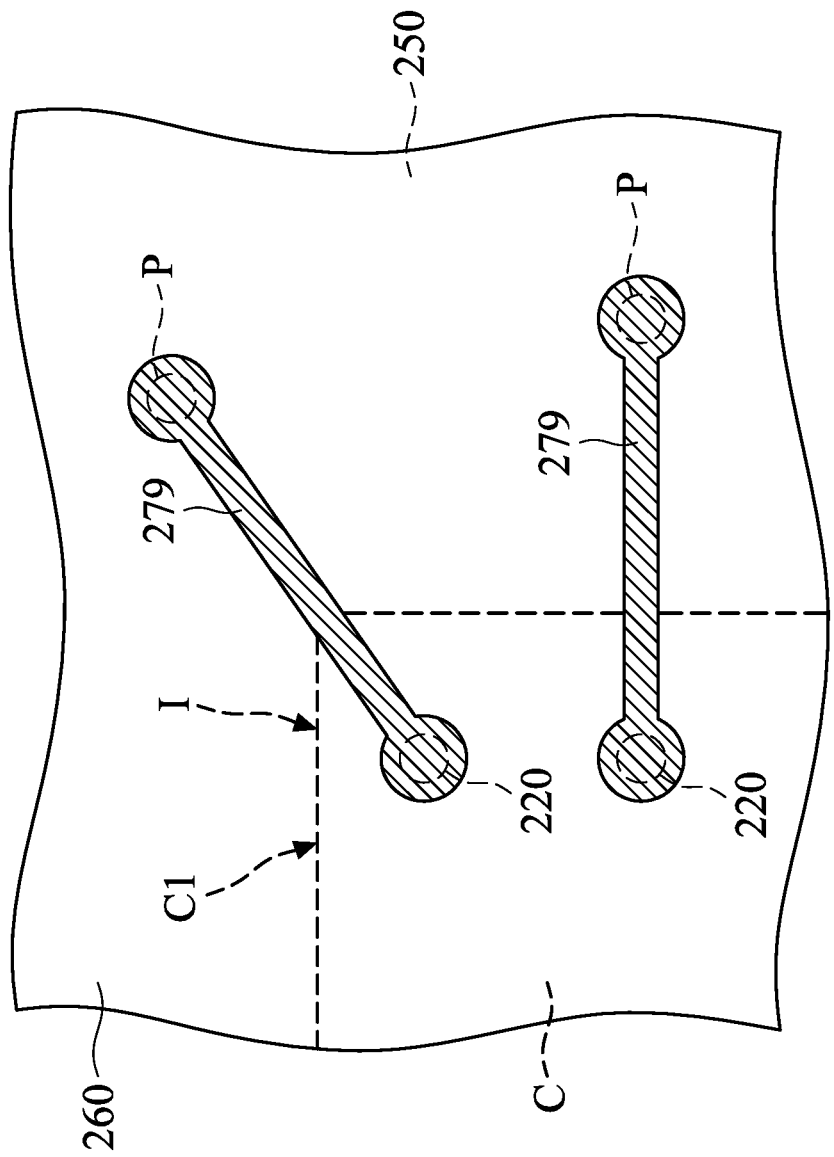
Figures 1, 1I, 2:
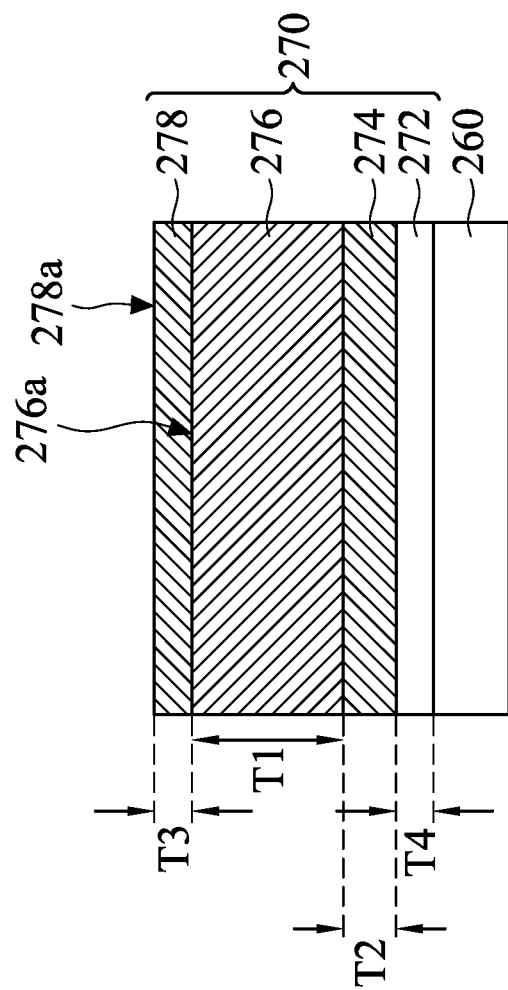
Figure 1J:
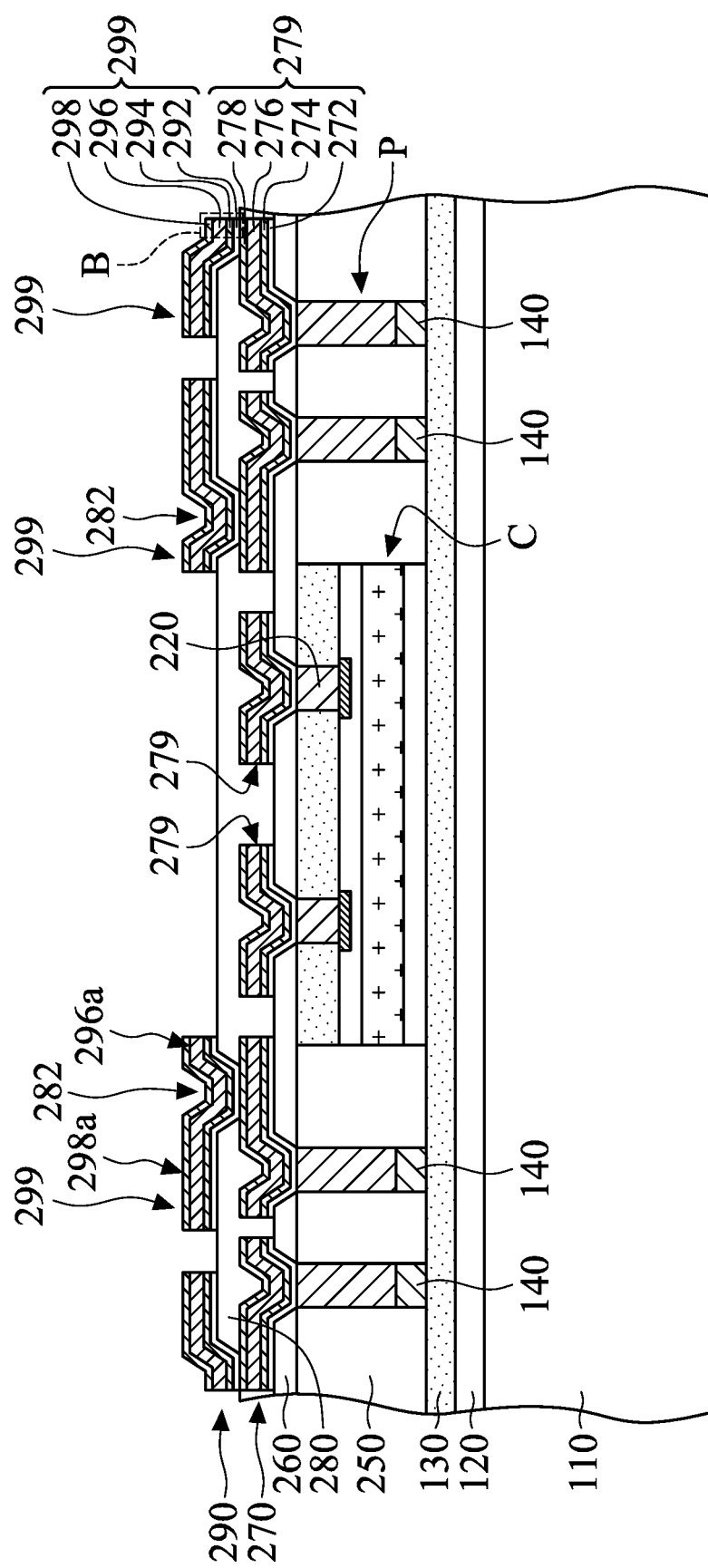
Figures 1, 1J:
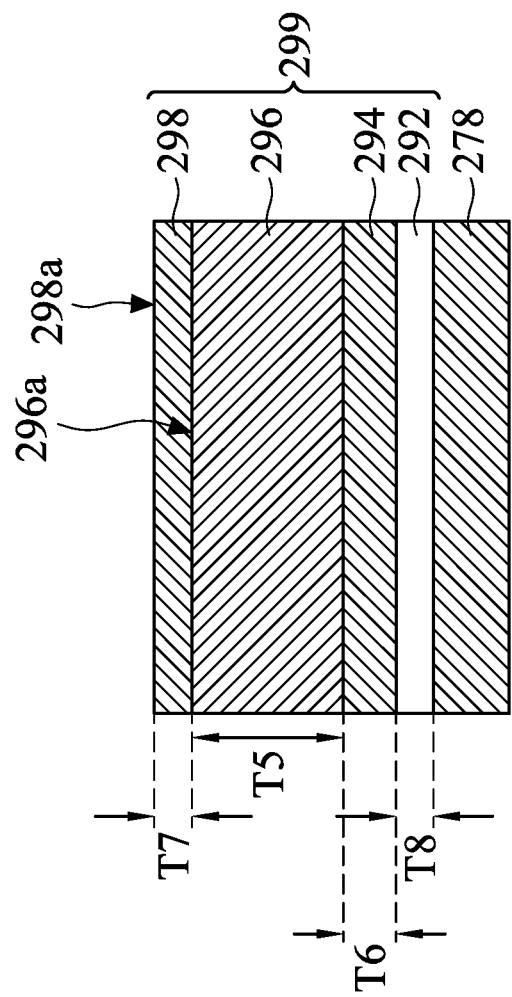
Figures 1, 1J, 2:
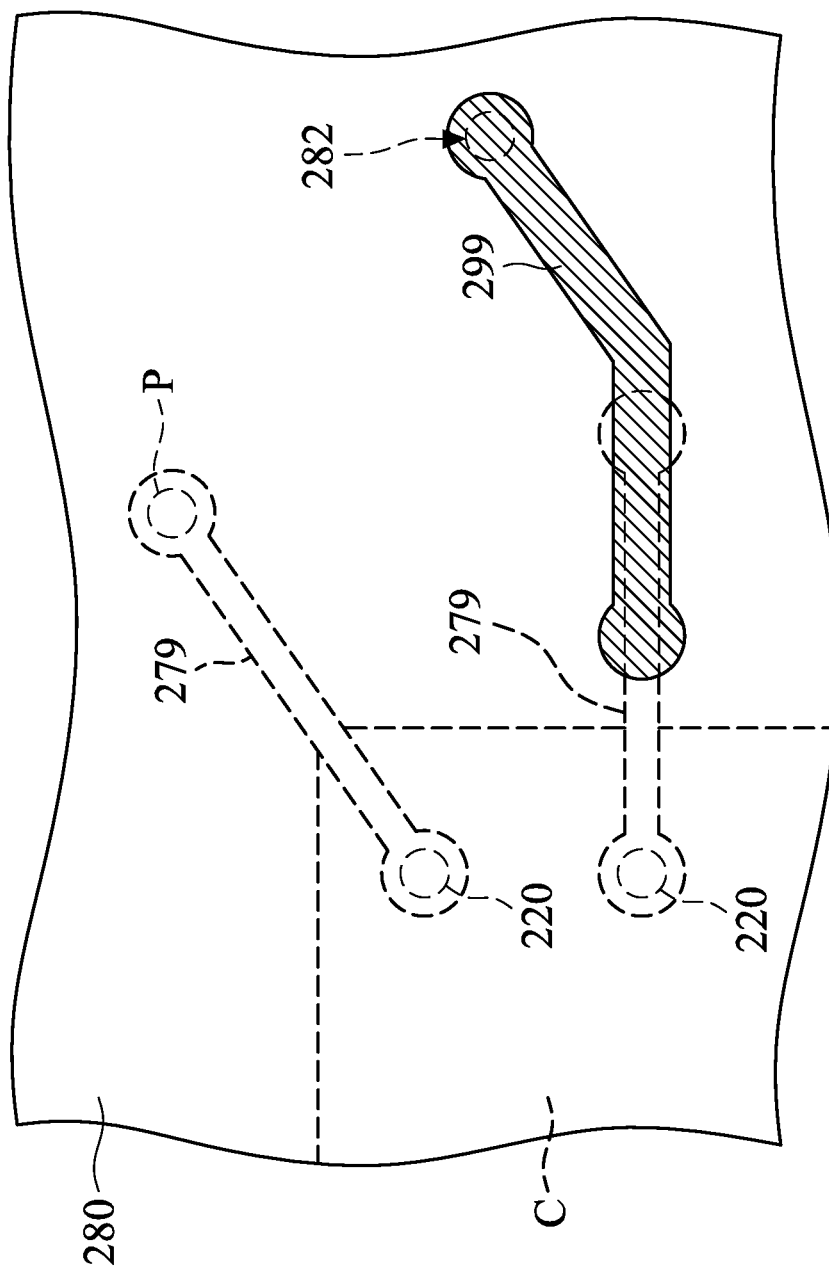
Figure 1K:
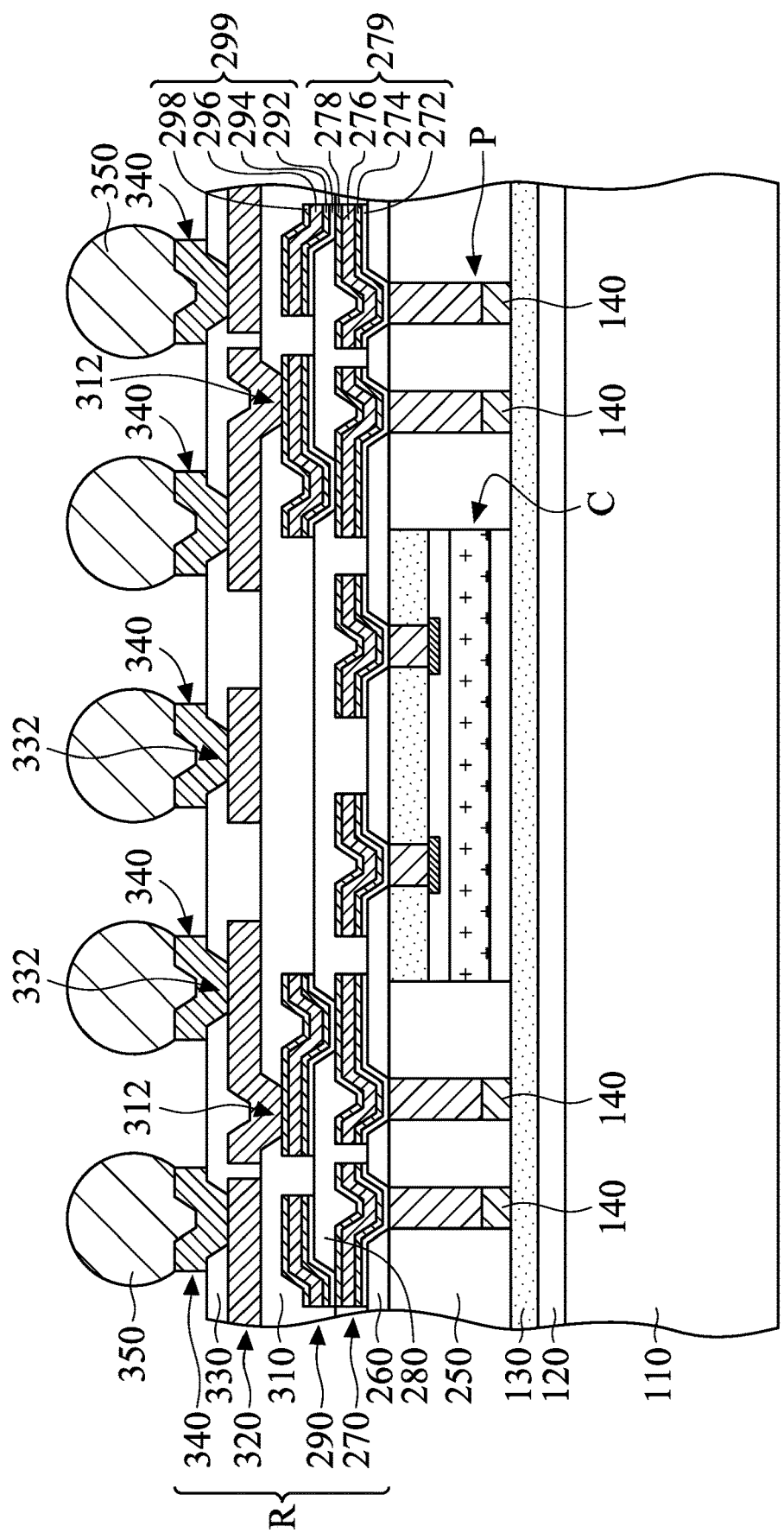
Figure 1L:
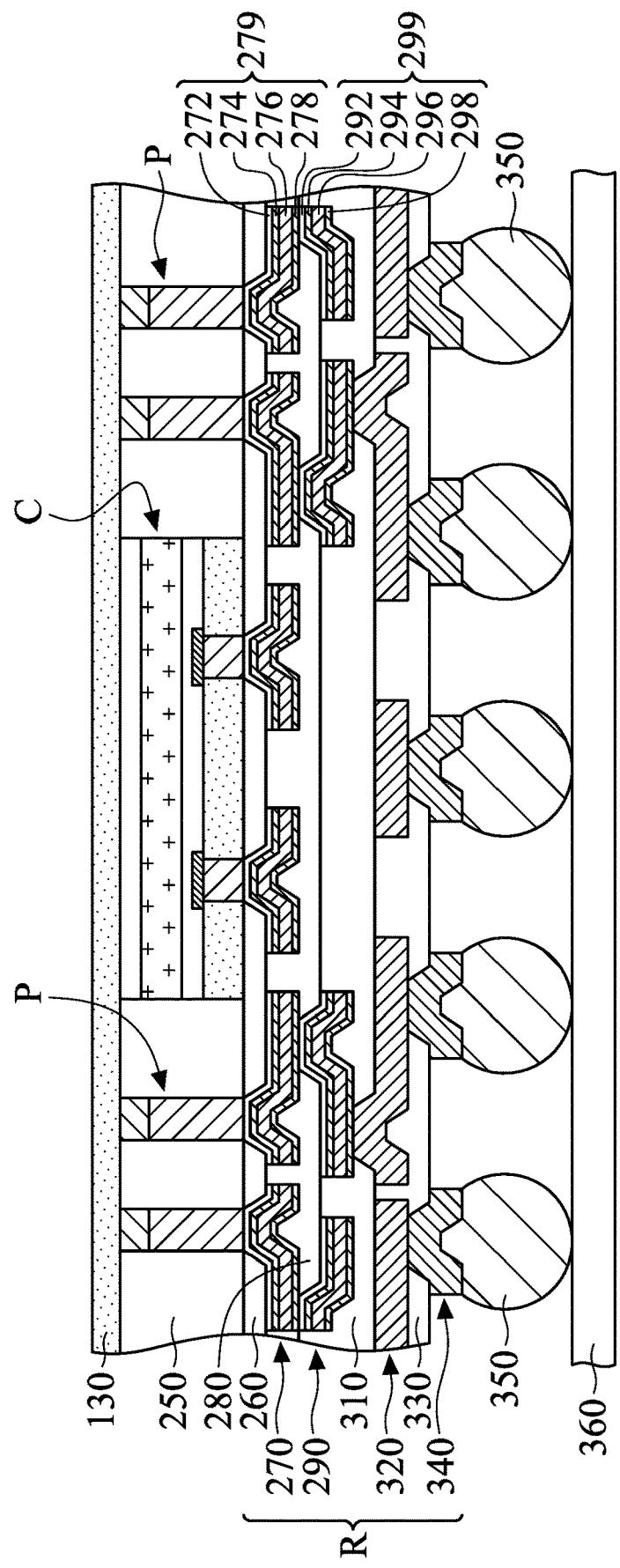
Figure 1M:
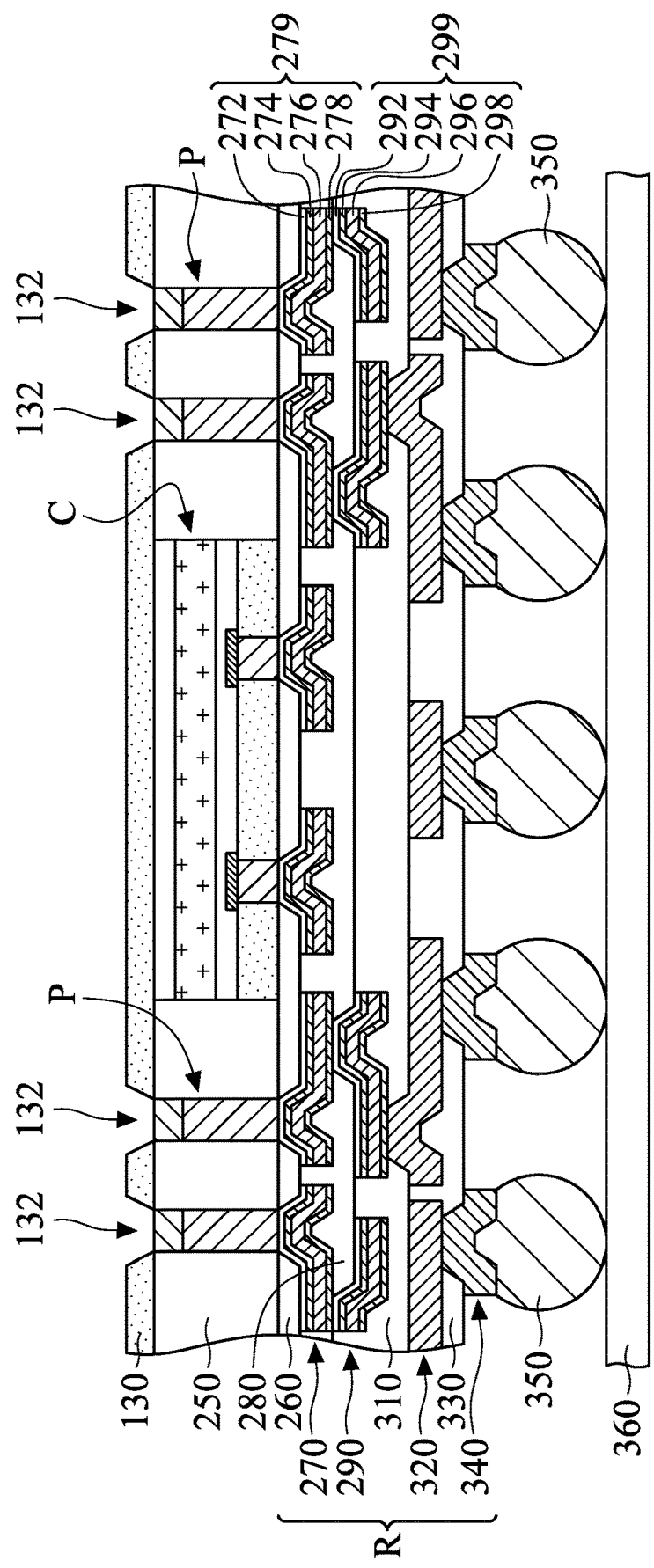
Figure 1N:
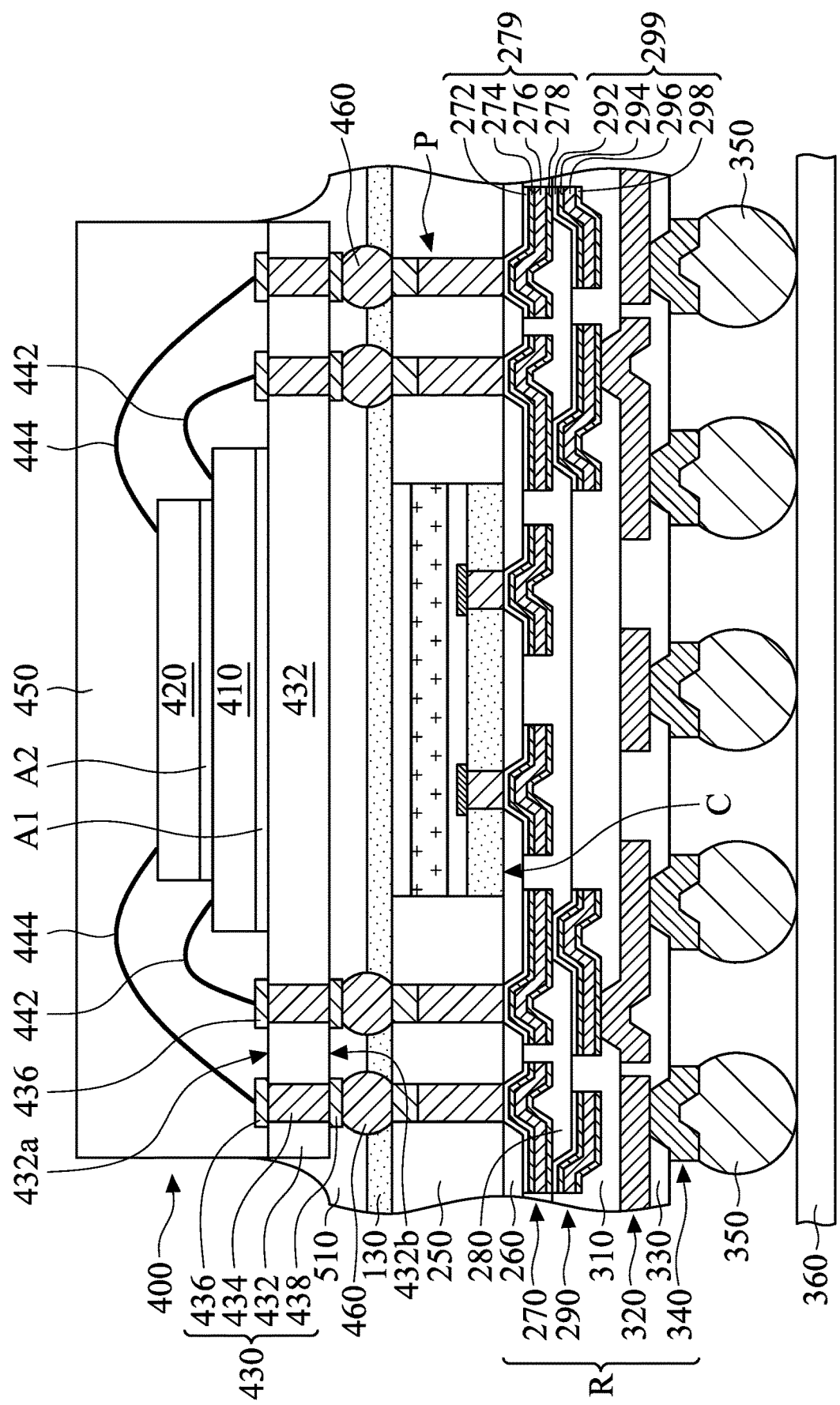
Figure 10:
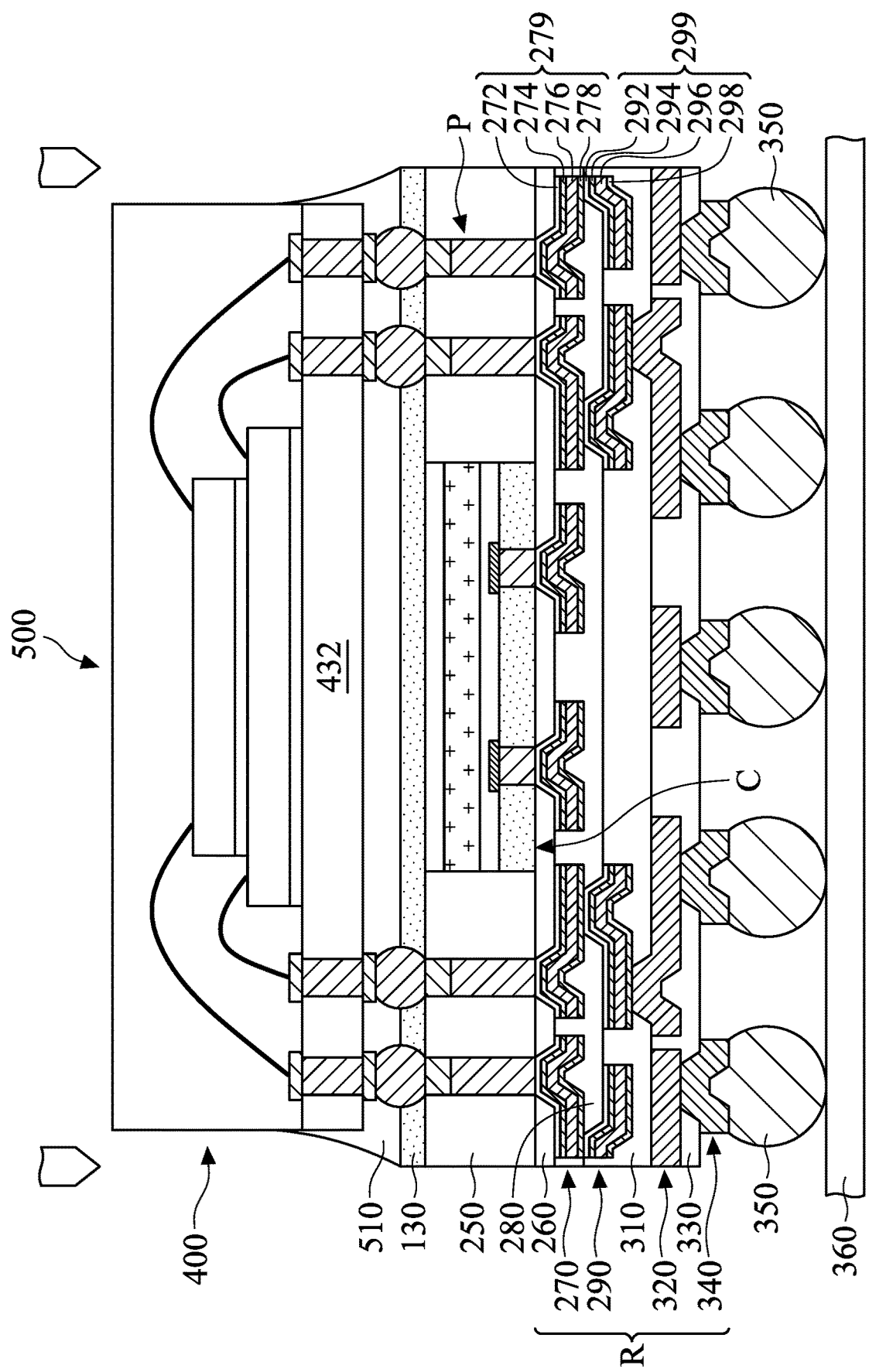
Figure 1P:
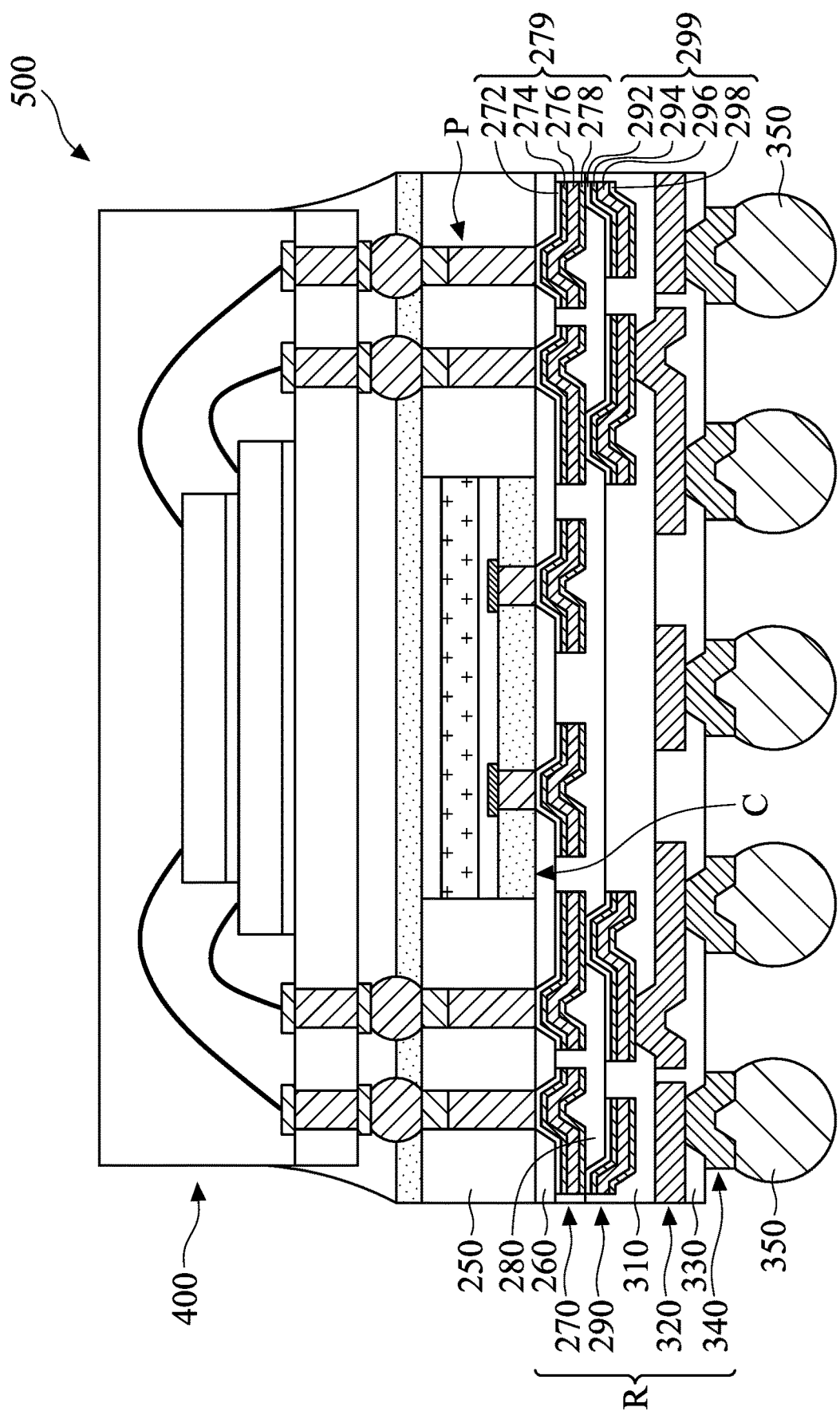
Figure 2:
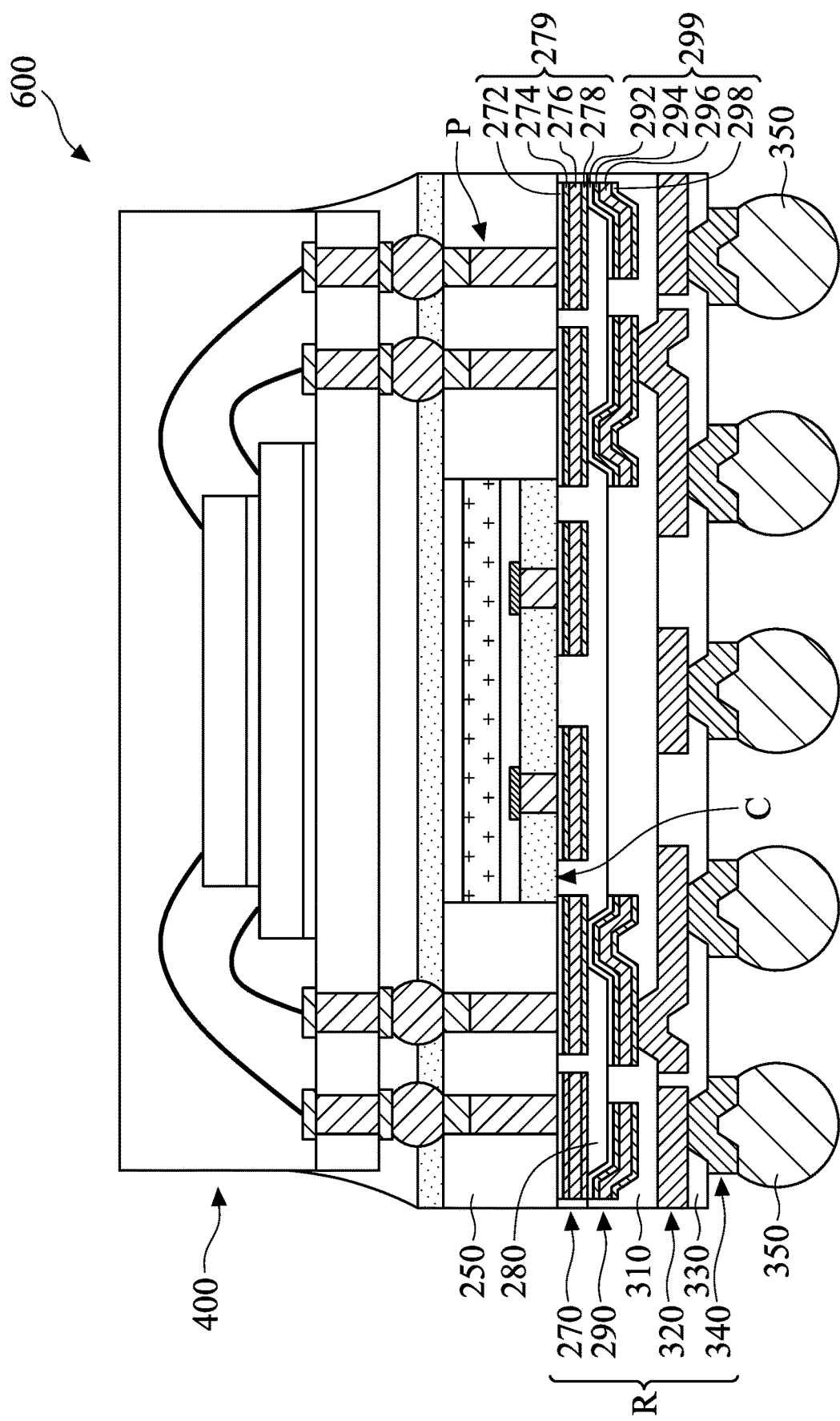
Figure 6:
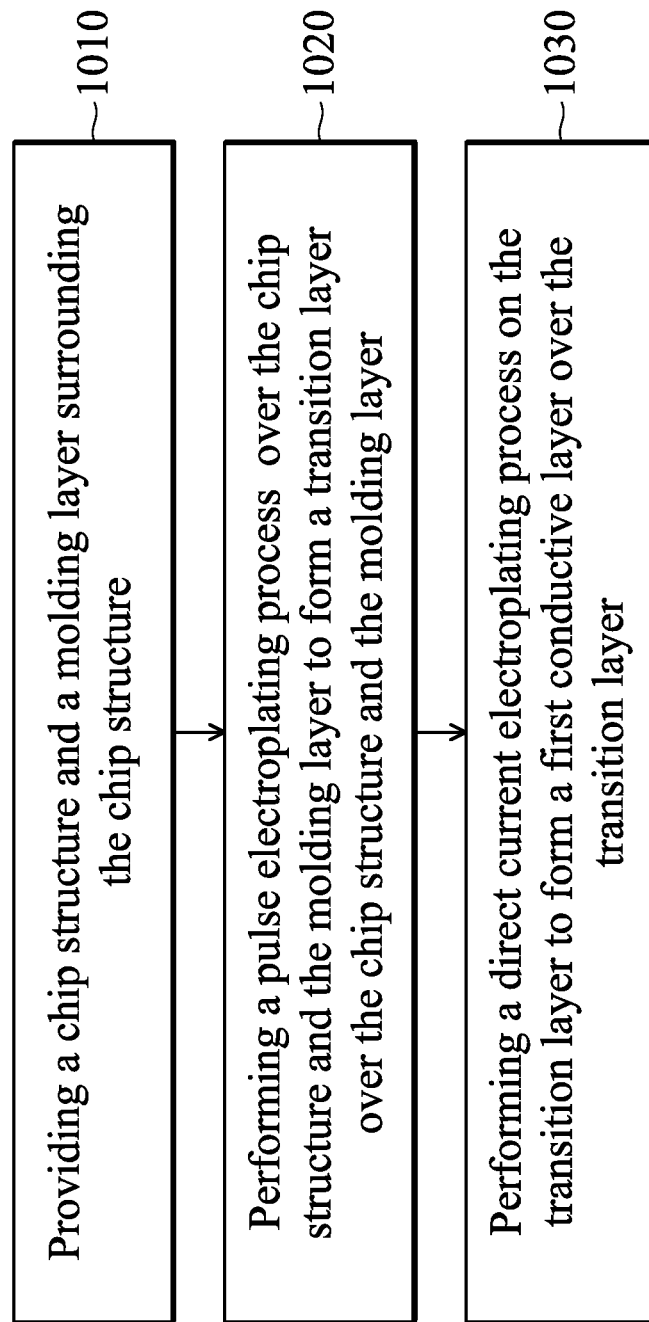
FIG. 6 is a flow chart for forming a semiconductor package structure, in accordance with some embodiments.

FIGS. 1A-1P are cross-sectional views of various stages of a process for forming a semiconductor package structure, in accordance with some embodiments. FIG. 6 is a flow chart for forming a semiconductor package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 includes any suitable adhesive material, such as an ultraviolet (UV) glue or a Light-to-Heat Conversion (LTHC) glue, which loses its adhesive properties when exposed to a UV light or laser, in accordance with some embodiments. The adhesive layer 120 is formed using a lamination process, a spin coating process, a printing process, or another suitable process.

As shown in FIG. 1A, a buffer layer 130 is formed over the adhesive layer 120, in accordance with some embodiments. The buffer layer 130 is configured to provide structural support for bonding and to help reduce die shift during subsequent processes, in accordance with some embodiments. The buffer layer 130 includes a polymer material, such as polybenzoxazole (PBO), polyimide, or epoxy, in accordance with some embodiments. The buffer layer 130 is formed using a spin coating process, a chemical vapor deposition process, a laminating process, or a printing process, in accordance with some embodiments.

As shown in FIG. 1A, a conductive layer 140 is formed over the buffer layer 130, in accordance with some embodiments. In some embodiments, the buffer layer 130 is not formed, and the conductive layer 140 is formed onto the adhesive layer 120. The conductive layer 140 includes copper, titanium, combinations thereof, or another suitable conductive material. The conductive layer 140 is formed using a physical vapor deposition process or a chemical vapor deposition process, in accordance with some embodiments.

As shown in FIG. 1B, a mask layer 150 is formed over the conductive layer 140, in accordance with some embodiments. The mask layer 150 has through holes 152 exposing portions of the conductive layer 140, in accordance with some embodiments. The mask layer 150 includes a photoresist material or another suitable material.

As shown in FIG. 1C, conductive pillars 160 are formed in the through holes 152, in accordance with some embodiments. The conductive pillars 160 are also referred to as conductive structures, in accordance with some embodiments. The conductive pillars 160 include copper or another suitable conductive material.

The formation of the conductive pillars 160 includes performing an electroplating process, in accordance with some embodiments. In some other embodiments, the conductive layer 140 is not formed, and the formation of the conductive pillars 160 includes performing a deposition process and a planarization process.

As shown in FIG. 1D, the mask layer 150 is removed, in accordance with some embodiments. The mask layer 150 is removed by dipping the mask layer 150 in a chemical solution, in accordance with some embodiments. The chemical solution includes, for example, ethyl lactate, anisole, methyl butyl acetate, amyl acetate, and/or diazo photoactive compound.

As shown in FIG. 1D, the conductive layer 140, which is not covered by the conductive pillars 160, is removed, in accordance with some embodiments. After the removal process, the conductive pillars 160 and the conductive layer 140 remaining thereunder are also referred to as conductive via structures P, in accordance with some embodiments. The removal process includes a wet etching process or a dry etching process, in accordance with some embodiments.

As shown in FIG. 1E, chip structures C are disposed over the buffer layer 130, in accordance with some embodiments (only one chip structure is shown in the drawings). For the sake of simplicity, FIG. 1E only shows one of the chip structures C. Each of the chip structures C includes a chip 170, in accordance with some embodiments. Each of the chip structures C further includes a dielectric layer 180, conductive pads 210, interconnection structures 220, and a dielectric layer 230, in accordance with some embodiments.

As shown in FIG. 1E, the chip 170 is disposed over the buffer layer 130, in accordance with some embodiments. The chip 170 is also referred to as a semiconductor substrate, a system-on-chip (SoC), a logic die, or a memory die, in accordance with some embodiments. In some embodiments, the chip 170 is made of at least a semiconductor material, such as silicon or another suitable semiconductor material.

The chip 170 has a front surface 172 and a back surface 174 opposite to the front surface 172, in accordance with some embodiments. In some embodiments, active elements (e.g. transistors, diodes, or the like) and/or passive elements (e.g. resistors, capacitors, inductors, or the like) are formed on the front surface 172 or in the chip 170 adjacent to the front surface 172.

As shown in FIG. 1E, in each of the chip structures C, the dielectric layer 180 is formed over the chip 170, in accordance with some embodiments. The conductive pads 210 are formed in the dielectric layer 180, in accordance with some embodiments. The conductive pads 210 are electrically connected to devices (not shown) formed in/over the chip 170, in accordance with some embodiments.

As shown in FIG. 1E, interconnection structures 220 are formed over the respective conductive pads 210, in accordance with some embodiments. The interconnection structures 220 include conductive pillars or conductive bumps, in accordance with some embodiments. The interconnection structures 220 are also referred to as conductive features, in accordance with some embodiments. As shown in FIG. 1E, a dielectric layer 230 is formed over the dielectric layer 180 and surrounds the interconnection structures 220, in accordance with some embodiments.

As shown in FIG. 1E, an adhesive layer 240 is positioned between the buffer layer 130 and the chip 170 so as to bond the chip 170 to the buffer layer 130, in accordance with some embodiments. The adhesive layer 240 is made of an insulating material, such as a polymer material, in accordance with some embodiments. In some embodiments, the adhesive layer 240 is a die attach film. In some embodiments, the buffer layer 130 is not formed, and the chip 170 with the adhesive layer 240 on the back surface 174 is disposed directly over the adhesive layer 120.

As shown in FIG. 1F, a molding layer 250 is formed over the buffer layer 130 to cover the conductive via structures P, the chip structures C, and the adhesive layer 240, in accordance with some embodiments. In some embodiments, the molding layer 250 is also referred to as a molding compound layer. The molding layer 250 includes a polymer material, in accordance with some embodiments. The molding layer 250 is formed using a molding process, a dispensing process, or a printing process, in accordance with some embodiments.

As shown in FIG. 1G, a top portion of the molding layer 250 is removed, in accordance with some embodiments. The removal process includes a chemical mechanical polishing process, in accordance with some embodiments. After the removal process, the molding layer 250 surrounds the chip structures C and the conductive via structures P with top surfaces thereof being exposed (step 1010 of FIG. 6), in accordance with some embodiments.

As shown in FIG. 1G, a dielectric layer 260 is formed over the molding layer 250 and the chip structures C, in accordance with some embodiments. The dielectric layer 260 is in direct contact with the molding layer 250 and the chip structures C, in accordance with some embodiments.

The dielectric layer 260 has openings 262 and 264, in accordance with some embodiments. The openings 262 correspondingly expose the interconnection structures 220, in accordance with some embodiments. The openings 264 correspondingly expose the conductive via structures P, in accordance with some embodiments. The dielectric layer 260 includes oxides (e.g., silicon oxide) or a polymer material, in accordance with some embodiments.

As shown in FIG. 1H, a seed layer 272 is conformally formed over the dielectric layer 260, the interconnection structures 220, and the conductive via structures P, in accordance with some embodiments. The seed layer 272 is in direct contact with the dielectric layer 260, the interconnection structures 220, and the conductive via structures P, in accordance with some embodiments.

The formation of the seed layer 272 includes performing a physical vapor deposition process to deposit a titanium layer (not shown) over the dielectric layer 260, the interconnection structures 220, and the conductive pillars 160; and performing a physical vapor deposition process to deposit a copper layer (not shown) over the titanium layer, in accordance with some embodiments.

As shown in FIG. 1H, a mask layer 273 is formed over the seed layer 272, in accordance with some embodiments. The mask layer 273 has trenches 273a, in accordance with some embodiments. The trenches 273a expose the seed layer 272 over the interconnection structures 220 and the conductive pillars 160, in accordance with some embodiments. The trenches 273a further expose the seed layer 272 between the interconnection structures 220 and the conductive pillars 160, in accordance with some embodiments.

The mask layer 273 is configured to define a wiring layer over the dielectric layer 260, in accordance with some embodiments. The mask layer 273 includes a polymer material, in accordance with some embodiments. The mask layer 273 is formed using a photolithography process, in accordance with some embodiments.

As shown in FIG. 1H, a transition layer 274 is formed over the seed layer 272 exposed by the opening 273a, in accordance with some embodiments. In some embodiments, the transition layer 274 is in direct contact with the seed layer 272. In some embodiments, the transition layer 274 conformally covers the seed layer 272 exposed by the opening 273a.

The transition layer 274 includes twinned copper and non-twinned copper, in accordance with some embodiments. The transition layer 274 includes twinned copper grains and non-twinned copper grains, in accordance with some embodiments. The twinned copper is also referred to as nano-twinned copper or nano-twin crystal copper.

The term of twin in materials represents two crystals with a mirror symmetry relationship, in accordance with some embodiments. The non-twinned copper is also referred to as untwinned copper, in accordance with some embodiments. The twinned copper includes (111)-oriented twinned copper, in accordance with some embodiments.

In some embodiments, a twinned copper volume percentage in the transition layer 274 increases in a direction V away from the chip structures C, the molding layer 250, and the conductive pillars 160. In some embodiments, the twinned copper volume percentage in the transition layer 274 continuously increases in the direction V. The formation of transition layer 274 includes performing a pulse electroplating process on the seed layer 272 to form the transition layer 274 (step 1020 of FIG. 6), in accordance with some embodiments.

The formation of the transition layer 274 uses an electroplating solution, in accordance with some embodiments. The electroplating solution includes copper sulfate, methyl sulfonate, and/or chlorine ion. The electroplating solution further includes organic acid (e.g. methyl sulfonate), gelatin, or a mixture thereof, in accordance with some embodiments.

As shown in FIG. 1H, a conductive layer 276 is directly formed on the transition layer 274, in accordance with some embodiments. The conductive layer 276 is substantially made of twinned copper, in accordance with some embodiments. The conductive layer 276 includes twinned copper grains, in accordance with some embodiments. In some embodiments, the term "substantially made of" means that an average twinned copper volume percentage in the entire conductive layer 276 is greater than 90 vol %.

In some embodiments, the average twinned copper volume percentage in the entire conductive layer 276 ranges from about 95 vol % to about 99.9 vol %. The average twinned copper volume percentage in the conductive layer 276 may be obtained by using an electron back-scatter diffraction (EBSD) analysis system or another suitable analysis system. The twinned copper includes (111)-oriented twinned copper, in accordance with some embodiments.

The formation of the conductive layer 276 includes performing a direct current electroplating process on the transition layer 274 to form the conductive layer 276 on the transition layer 274 (step 1030 of FIG. 6), in accordance with some embodiments. The formation of the conductive layer 276 uses an electroplating solution, in accordance with some embodiments.

The electroplating solution includes copper sulfate, methyl sulfonate, and/or chlorine ion. The electroplating solution further includes organic acid (e.g. methyl sulfonate), gelatin, or a mixture thereof, in accordance with some embodiments.

In some embodiments, the formation of the transition layer 274 and the formation of the conductive layer 276 use the same electroplating solution. In some embodiments, the formation of the transition layer 274 and the formation of the conductive layer 276 are performed in the same plating tank.

As shown in FIG. 1H, a conductive layer 278 is formed over the conductive layer 276, in accordance with some embodiments. The conductive layer 276 is in direct contact with the conductive layer 278 and the transition layer 274, in accordance with some embodiments.

In some embodiments, an average roughness of a top surface 278a of the conductive layer 278 is less than an average roughness of a top surface 276a of the conductive layer 276. The conductive layer 278 includes copper or another suitable conductive material. The conductive layer 278 may also referred to as a bright copper layer. The smooth top surface 278a of the conductive layer 278 has a good light reflectivity. Therefore, the conductive layer 278 improves photolithography alignment accuracy of subsequent photolithography processes.

The conductive layer 278 is formed using a direct current electroplating process, in accordance with some embodiments. The formation of the conductive layer 278 uses an electroplating solution that is different from the electroplating solution used in the formation of the conductive layer 276 and the transition layer 274, in accordance with some embodiments.

As shown in FIG. 1I, the mask layer 273 is removed, in accordance with some embodiments. As shown in FIG. 1I, the seed layer 272 originally under the mask layer 273 is removed, in accordance with some embodiments. The seed layer 272 is removed using an etching process, in accordance with some embodiments.

At this stage, the transition layer 274 and the conductive layer 276 together form conductive lines 279, in accordance with some embodiments. The conductive lines 279 are also referred to as conductive structures or redistribution structures, in accordance with some embodiments. The twinned copper volume percentage in the transition layer 274 increases toward the conductive layer 276, in accordance with some embodiments. The conductive lines 279 further include the seed layer 272 and the conductive layer 278, in accordance with some embodiments. The conductive lines 279 together form a wiring layer 270, in accordance with some embodiments. The conductive lines 279 are also referred to as conductive structures, in accordance with some embodiments.

The conductive lines 279 are electrically connected to the conductive via structures P and the interconnection structures 220 of the chip structure C, in accordance with some embodiments. There is an interface I (or a boundary) between the chip structures C and the molding layer 250, in accordance with some embodiments. The conductive lines 279 extend across the interface I, in accordance with some embodiments.

The chip structures C and the molding layer 250 have different thermal expansion coefficients, which may induce thermal stress in the conductive lines 279 over the interface I during subsequent annealing processes. Since twinned copper has a Young's modulus and a tensile strength greater than that of non-twinned copper, twinned copper may withstand greater stress. Therefore, twinned copper in the conductive layer 276 may prevent the conductive lines 279 from cracking. Therefore, the yield of the conductive lines 279 is improved.

FIG. 1I-1 is a top-view of two of the conductive lines 279, a corner portion of the chip structure C, and portions of the dielectric layer 260 and the molding layer 250 in FIG. 1I, in accordance with some embodiments. As shown in FIGS. 1I and 1I-1, the chip structure C has a corner portion C1, in accordance with some embodiments. The conductive lines 279 extend across the interface I between the corner portion C1 and the molding layer 250, in accordance with some embodiments.

The interface I between the corner portion C1 and the molding layer 250 may induce more thermal stress than that between other portions of the chip structure C and the molding layer 250. Since twinned copper may withstand greater stress, there may be no need to avoid forming the conductive lines 279 over the interface I between the corner portion C1 and the molding layer 250. Therefore, layout flexibility and layout area may be increased.

FIG. 1I-2 is an enlarged figure of the region A in FIG. 1I, in accordance with some embodiments. As shown in FIGS. 1I and 1I-2, a thickness T1 of the conductive layer 276 is greater than a thickness T2 of the transition layer 274, in accordance with some embodiments. The thickness T1 of the conductive layer 276 is greater than a thickness T3 of the conductive layer 278, in accordance with some embodiments. The thickness T1 of the conductive layer 276 is greater than a thickness T4 of the seed layer 272, in accordance with some embodiments.

The thickness T1 ranges from about 0.5 μm to about 10 μm, in accordance with some embodiments. The thickness T2 ranges from about 0.05 μm to about 0.5 μm, in accordance with some embodiments. The thickness T3 ranges from about 0.3 μm to about 0.5 μm, in accordance with some embodiments.

In some embodiments, an average volume percentage of twinned copper in the conductive layer 276 is greater than an average volume percentage of twinned copper in the transition layer 274. In some embodiments, the average volume percentage of twinned copper in the conductive layer 276 is greater than an average volume percentage of twinned copper in the conductive layer 278.

As shown FIG. 1J, the processes of FIGS. 1G-1I are performed again over the dielectric layer 260 and the wiring layer 270 to form a dielectric layer 280 and a wiring layer 290, in accordance with some embodiments. The dielectric layer 280 is formed over the dielectric layer 260 and the wiring layer 270, in accordance with some embodiments.

The dielectric layer 280 has openings 282, in accordance with some embodiments. The openings 282 expose portions of the wiring layer 270, in accordance with some embodiments.

The wiring layer 290 is formed over the dielectric layer 280, in accordance with some embodiments. The wiring layer 290 extends into the openings 282 to be electrically connected to the wiring layer 270, in accordance with some embodiments. The wiring layer 290 includes conductive lines 299, in accordance with some embodiments. The conductive lines 299 are also referred to as conductive structures or redistribution structures, in accordance with some embodiments.

FIG. 1J-2 is a top-view of the conductive lines 279 and 299 and portions of the dielectric layer 280 and the chip structure C in FIG. 1J, in accordance with some embodiments. As shown in FIGS. 1J and 1J-2, an average line width of the conductive lines 279 is less than an average line width of the conductive lines 299. The average line width of the conductive lines 279 is less than about 10 μm, in accordance with some embodiments. The conductive lines 299 are in direct contact with the conductive lines 279, in accordance with some embodiments.

Each of the conductive lines 299 includes a seed layer 292, a transition layer 294, and conductive layers 296 and 298, in accordance with some embodiments. The seed layer 292, the transition layer 294, and the conductive layers 296 and 298 are sequentially stacked on the dielectric layer 280 and the exposed wiring layer 270, in accordance with some embodiments.

The structures, the materials, the forming methods of the seed layer 292, the transition layer 294, and the conductive layers 296 and 298 are respectively the same as or similar to the seed layer 272, the transition layer 274, and the conductive layers 276 and 278, in accordance with some embodiments.

The seed layer 292 is conformally formed over the dielectric layer 280 and the exposed wiring layer 270, in accordance with some embodiments. The seed layer 292 is in direct contact with the dielectric layer 280 and the exposed wiring layer 270, in accordance with some embodiments.

The transition layer 294 is conformally formed over the seed layer 292, in accordance with some embodiments. The transition layer 294 includes twinned copper, in accordance with some embodiments. The twinned copper includes (111)-oriented twinned copper, in accordance with some embodiments.

In some embodiments, a twinned copper volume percentage in the transition layer 294 increases toward the conductive layer 296. In some embodiments, the twinned copper volume percentage in the transition layer 294 continuously increases toward the conductive layer 296. The formation of the transition layer 294 includes performing a pulse electroplating process on the seed layer 292 to form the transition layer 294, in accordance with some embodiments.

The conductive layer 296 is directly formed on the transition layer 294, in accordance with some embodiments. The conductive layer 296 is substantially made of twinned copper, in accordance with some embodiments. In some embodiments, the term "substantially made of" means that an average twinned copper volume percentage in the entire conductive layer 296 is greater than 90 vol %.

In some embodiments, the average twinned copper volume percentage in the entire conductive layer 296 ranges from about 95 vol % to about 99.9 vol %. The twinned copper includes (111)-oriented twinned copper, in accordance with some embodiments.

The formation of the conductive layer 296 includes performing a direct current electroplating process on the transition layer 294 to form the conductive layer 296 on the transition layer 294, in accordance with some embodiments.

In some embodiments, the formation of the transition layer 294 and the formation of the conductive layer 296 use the same electroplating solution. In some embodiments, the formation of the transition layer 294 and the formation of the conductive layer 296 are performed in the same plating tank.

The conductive layer 298 is formed over the conductive layer 296, in accordance with some embodiments. The conductive layer 296 is in direct contact with the conductive layer 298 and the transition layer 294, in accordance with some embodiments.

In some embodiments, an average roughness of a top surface 298a of the conductive layer 298 is less than an average roughness of a top surface 296a of the conductive layer 296. The conductive layer 298 includes copper or another suitable conductive material. The conductive layer 298 may also referred to as a bright copper layer.

FIG. 1J-1 is an enlarged figure of the region B in FIG. 1J, in accordance with some embodiments. As shown in FIGS. 1J and 1J-1, a thickness T5 of the conductive layer 296 is greater than a thickness T6 of the transition layer 294, in accordance with some embodiments. The thickness T5 of the conductive layer 296 is greater than a thickness T7 of the conductive layer 298, in accordance with some embodiments. The thickness T5 of the conductive layer 296 is greater than a thickness T8 of the seed layer 292, in accordance with some embodiments.

The thickness T5 ranges from about 0.5 µm to about 10 µm, in accordance with some embodiments. The thickness T6 ranges from about 0.05 µm to about 0.5 µm, in accordance with some embodiments. The thickness T7 ranges from about 0.3 µm to about 0.5 µm, in accordance with some embodiments.

In some embodiments, an average volume percentage of twinned copper in the conductive layer 296 is greater than an average volume percentage of twinned copper in the transition layer 294. In some embodiments, the average volume percentage of twinned copper in the conductive layer 296 is greater than an average volume percentage of twinned copper in the conductive layer 298.

As shown in FIG. 1K, a dielectric layer 310 is formed over the dielectric layer 280 and the wiring layer 290, in accordance with some embodiments. The dielectric layer 310 has openings 312 exposing portions of the wiring layer 290, in accordance with some embodiments.

As shown in FIG. 1K, a wiring layer 320 is formed over the dielectric layer 310, in accordance with some embodiments. The wiring layer 320 is also referred to as a conductive structure or a redistribution structure, in accordance with some embodiments. The wiring layer 320 extends into the openings 312 to be electrically connected to and in direct contact with the wiring layer 290, in accordance with some embodiments.

The forming method of the wiring layer 320 includes forming a seed layer (not shown) over the dielectric layer 310 and the exposed wiring layer 290; and performing an electroplating process on the seed layer to form a conductive layer (not shown). The wiring layer 320 includes a conductive material, such as copper or copper alloy (e.g. copper-silver alloy, copper-gold alloy, or copper-tin alloy), in accordance with some embodiments. In some other embodiments, the forming method of the wiring layer 320 is the same as the forming method of the wiring layer 270 or 290.

As shown in FIG. 1K, a dielectric layer 330 is formed over the dielectric layer 310 and the wiring layer 320, in accordance with some embodiments. The dielectric layer 330 has openings 332 exposing portions of the wiring layer 320, in accordance with some embodiments.

As shown in FIG. 1K, conductive pads 340 are formed over the dielectric layer 330 and the exposed wiring layer 320, in accordance with some embodiments. The conductive pads 340 are also referred to as conductive structures, in accordance with some embodiments. The forming method of the conductive pads 340 includes forming a seed layer (not shown) over the dielectric layer 330 and the exposed wiring layer 320; and performing an electroplating process on the seed layer to form a conductive layer (not shown).

The conductive pads 340 include metal or alloy, in accordance with some embodiments. The conductive pads 340 include copper or copper alloy, such as copper-silver alloy, copper-gold alloy, or copper-tin alloy, in accordance with some embodiments.

In some other embodiments, the forming method of the conductive pads 340 is the same as the forming method of the wiring layer 270 or 290. The wiring layers 270, 290, and 320, the dielectric layers 280, 310, and 330, and the conductive pads 340 together form a redistribution structure R, in accordance with some embodiments.

As shown in FIG. 1K, conductive bumps 350 are formed over the conductive pads 340, in accordance with some embodiments. The conductive bumps 350 include tin (Sn) or another suitable material. The formation of the conductive bumps 350 includes forming a solder ball with flux over the conductive pads 340 and reflowing the solder ball, in accordance with some embodiments.

As shown in FIG. 1L, the chip structures C are flipped upside down and disposed over a frame 360 (or a carrier), in accordance with some embodiments. As shown in FIG. 1L, the carrier substrate 110 and the adhesive layer 120 are removed, in accordance with some embodiments.

As shown in FIG. 1M, portions of the buffer layer 130 are removed to form openings 132 in the buffer layer 130, in accordance with some embodiments. The openings 132 expose the conductive via structures P, in accordance with some embodiments. The removal process may be a photolithography process, a laser drilling process, or an etching process, in accordance with some embodiments. In some other embodiments, the buffer layer 130 is completely removed to expose the conductive via structures P. In some embodiments (not shown), the buffer layer 130 is not formed over the carrier substrate 110, and the conductive via structures P are directly exposed after carrier substrate 110 and the adhesive layer 120 are removed.

As shown in FIG. 1N, chip packages 400 are disposed over the chip structures C and the molding layer 250 to bond with the conductive via structures P, in accordance with some embodiments. Each of the chip packages 400 includes chips 410 and 420, a substrate 430, conductive lines 442 and 444, a molding layer 450, and conductive bumps 460, in accordance with some embodiments.

The chips 410 and 420 are disposed over the substrate 430, in accordance with some embodiments. The chip 410 is bonded to the substrate 430 through an adhesive layer A1 therebetween, in accordance with some embodiments. The chip 420 is bonded to the chip 410 through an adhesive layer A2 therebetween, in accordance with some embodiments.

The substrate 430 includes a dielectric layer 432, conductive via structures 434, and conductive pads 436 and 438, in accordance with some embodiments. The dielectric layer 432 may have dielectric films (not shown) stacked on each other. The dielectric layer 432 has opposite surfaces 432a and 432b, in accordance with some embodiments. The conductive via structures 434 pass through the dielectric layer 432, in accordance with some embodiments.

The conductive pads 436 are positioned over the surface 432a, in accordance with some embodiments. The conductive pads 436 are positioned over the respective conductive via structures 434 to electrically connect to the respective conductive via structures 434, in accordance with some embodiments.

The conductive pads 438 are positioned over the surface 432b, in accordance with some embodiments. The conductive pads 438 are positioned under the respective conductive via structures 434 to electrically connect to the respective conductive via structures 434, in accordance with some embodiments.

The conductive lines 442 physically and electrically connect the chip 410 to the conductive pads 436, in accordance with some embodiments. The conductive lines 444 physically and electrically connect the chip 420 to the conductive pads 436, in accordance with some embodiments. The molding layer 450 is molded over the chips 410 and 420, the conductive lines 442 and 444, and the substrate 430, in accordance with some embodiments.

The molding layer 450 is configured to protect the chips 410 and 420 and the conductive lines 442 and 444 from damage and contamination during subsequent processes, in accordance with some embodiments. The molding layer 450 includes a polymer material, in accordance with some embodiments.

The chip package 400 shown in FIG. 1N is an example. The chip package 400 is not limited to the type of the chip package 400 shown in FIG. 1N. That is, the chip packages 400 may be any suitable type of chip package. For example, the chip package 400 includes a package-on-package (PoP) type semiconductor package, a multi-chip stacked package, a chip package including chips stacked on a substrate, a chip package including only one chip, or another suitable type of chip package.

The conductive bumps 460 connect the conductive pads 438 to the conductive via structures P, in accordance with some embodiments. The conductive bumps 460 pass through the buffer layer 130, in accordance with some embodiments. The conductive bumps 460 are between the substrate 430 and the molding layer 250, in accordance with some embodiments.

As shown in FIG. 1N, an underfill layer 510 is filled between the substrate 430 and the buffer layer 130, in accordance with some embodiments. The underfill layer 510 is in direct contact with the buffer layer 130 and the substrate 430, in accordance with some embodiments. The underfill layer 510 surrounds the conductive bumps 460, in accordance with some embodiments. The underfill layer 510 includes a polymer material, in accordance with some embodiments.

As shown in FIG. 1O, a mechanical singulation process is performed over the underfill layer 510, the buffer layer 130, the molding layer 250, and the dielectric layer 310, in accordance with some embodiments. The mechanical singulation process cuts through the underfill layer 510, the buffer layer 130, the molding layer 250, and the dielectric layer 310 so as to form individual semiconductor package structures 500, in accordance with some embodiments. As shown in FIG. 1P, the frame 360 (or the carrier) is removed, in accordance with some embodiments.

Each of the semiconductor package structures 500 includes the chip package 400, the chip structure C, the molding layer 250, the redistribution structure R, the conductive bumps 350, and the conductive via structures P, in accordance with some embodiments.

FIG. 2 is a cross-sectional view of a semiconductor package structure, in accordance with some embodiments. As shown in FIG. 2, the semiconductor package structure 600 is similar to the semiconductor package structure 500 of FIG. 1P, except that the semiconductor package structure 600 does not have the dielectric layer 260, in accordance with some embodiments. Therefore, the wiring layer 270 is in direct contact with the molding layer 250, the chip structure C, and the conductive via structure P, in accordance with some embodiments.

Figure 3:
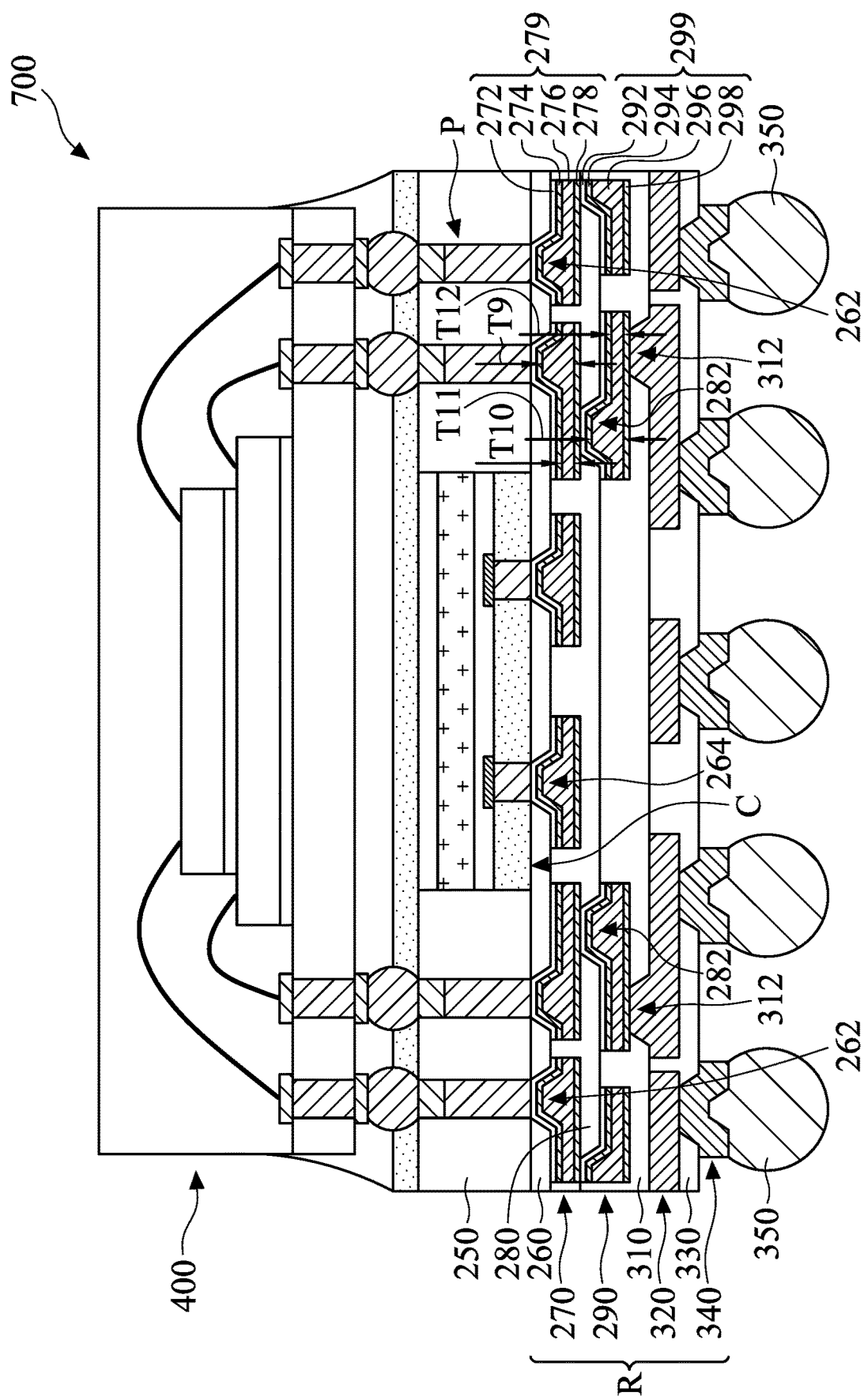
FIG. 3 is a cross-sectional view of a semiconductor package structure, in accordance with some embodiments.

FIG. 3 is a cross-sectional view of a semiconductor package structure, in accordance with some embodiments. As shown in FIG. 3, the semiconductor package structure 700 is similar to the semiconductor package structure 500 of FIG. 1P, except that the wiring layers 270, 290, and 320 of the semiconductor package structure 700 completely fill the entire openings 262, 264, 282, and 312 respectively, in accordance with some embodiments.

The conductive layer 276 in and under the openings 262 is thicker than the conductive layer 276 outside of the openings 262, in accordance with some embodiments. The conductive layer 296 in and under the openings 282 is thicker than the conductive layer 296 outside of the openings 282, in accordance with some embodiments.

That is, a thickness T9 of the conductive layer 276 in and under the openings 262 is greater than a thickness T10 of the conductive layer 276 outside of the openings 262, in accordance with some embodiments. a thickness T11 of the conductive layer 296 in and under the openings 282 is greater than a thickness T12 of the conductive layer 296 outside of the openings 282.

Figure 4:
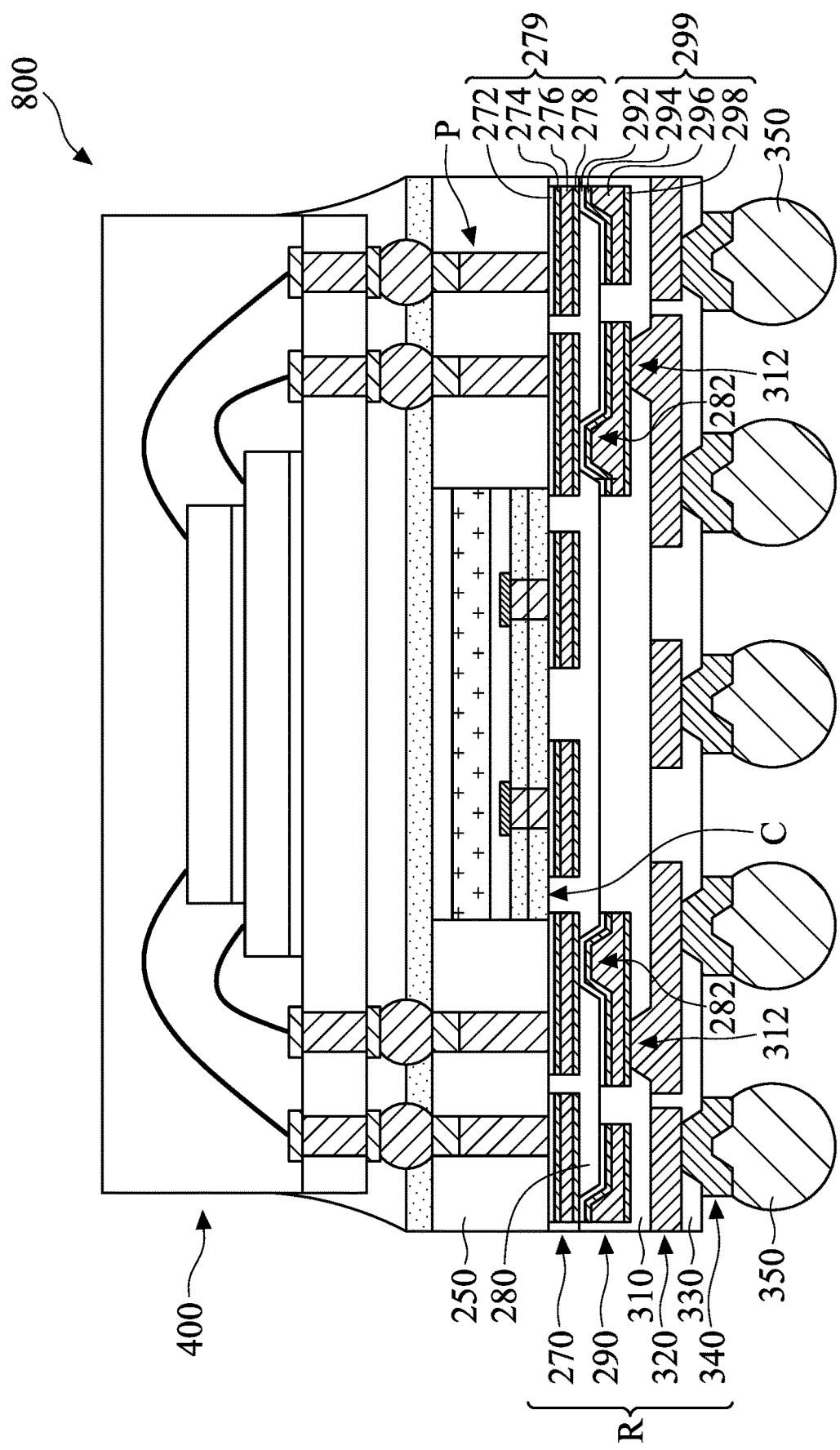
FIG. 4 is a cross-sectional view of a semiconductor package structure, in accordance with some embodiments.

FIG. 4 is a cross-sectional view of a semiconductor package structure, in accordance with some embodiments. As shown in FIG. 4, the semiconductor package structure 800 is similar to the semiconductor package structure 700 of FIG. 3, except that the semiconductor package structure 800 does not have a dielectric layer 260, in accordance with some embodiments. Therefore, the wiring layer 270 is in direct contact with the molding layer 250, the chip structure C, and the conductive via structure P, in accordance with some embodiments.

Figure 5:
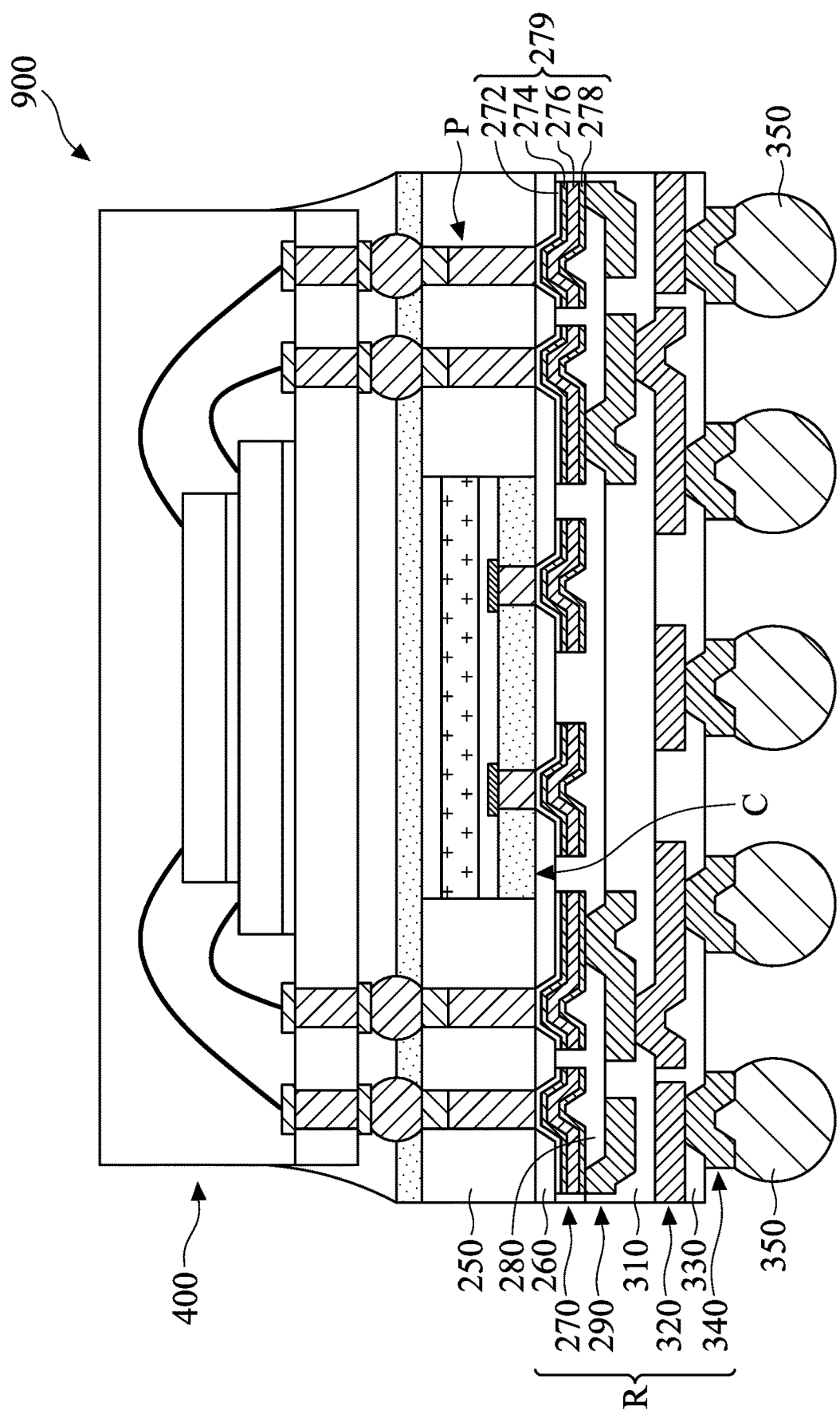
FIG. 5 is a cross-sectional view of a semiconductor package structure, in accordance with some embodiments.

FIG. 5 is a cross-sectional view of a semiconductor package structure, in accordance with some embodiments. As shown in FIG. 5, the semiconductor package structure 900 is similar to the semiconductor package structure 500 of FIG. 1P, except that the forming method of the wiring layer 290 of the semiconductor package structure 900 is the same as that of the wiring layer 320 of FIG. 1K, in accordance with some embodiments. The wiring layer 290 is made of a conductive material, such as copper or copper alloy (e.g. copper-silver alloy, copper-gold alloy, or copper-tin alloy).

Figure 7:
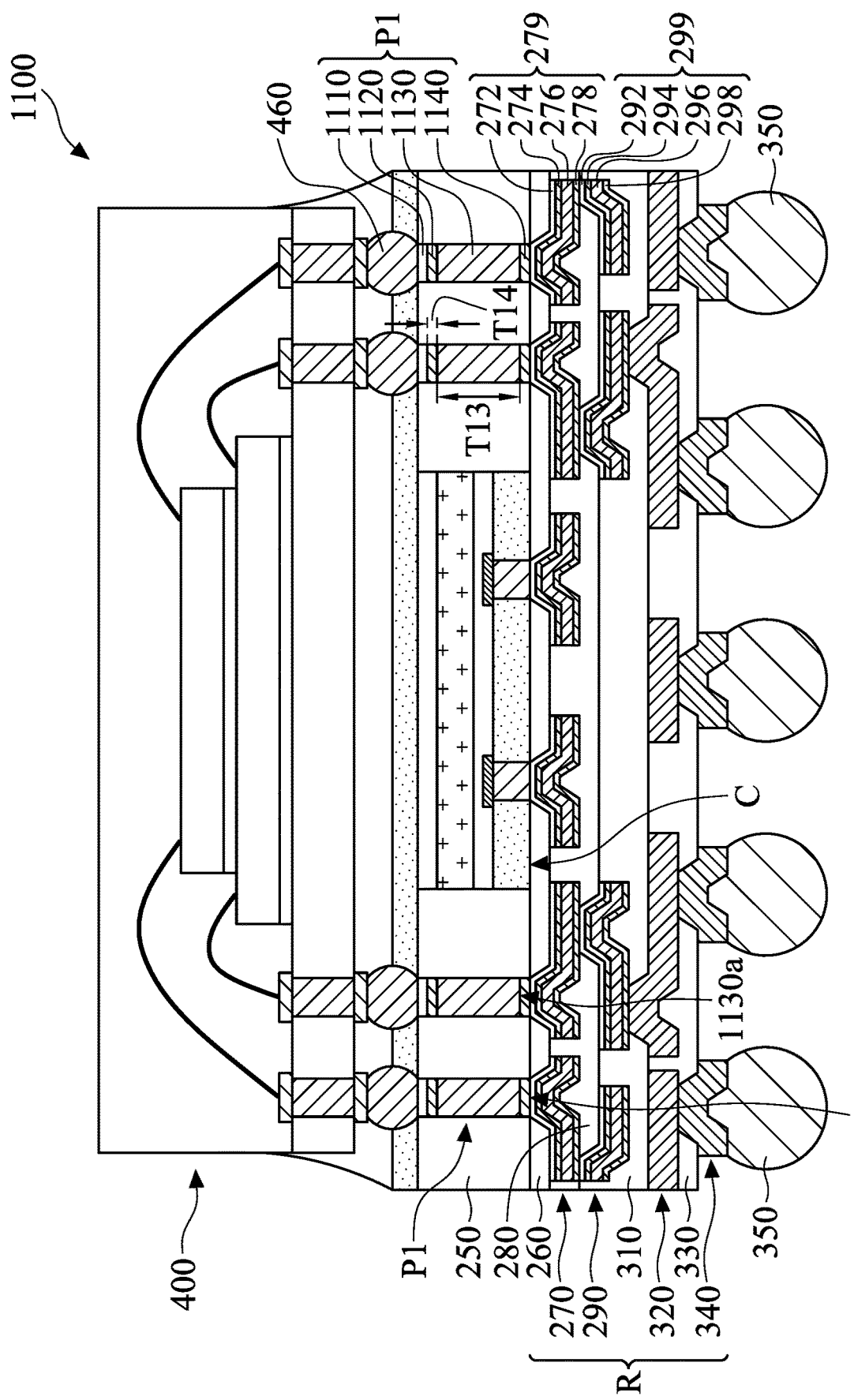
FIG. 7 is a cross-sectional view of a semiconductor package structure, in accordance with some embodiments.

In some embodiments, twinned copper is not only able to be used in the conductive lines, but also to be used in other conductive structures (e.g., conductive via structures). FIG. 7 is a cross-sectional view of a semiconductor package structure, in accordance with some embodiments. As shown in FIG. 7, the semiconductor package structure 1100 is similar to the semiconductor package structure 500 of FIG. 1P, except that the semiconductor package structure 1100 includes conductive via structures P1 and does not include the conductive via structures P of the semiconductor package structure 500 of FIG. 1P, in accordance with some embodiments.

Each of the conductive via structures P1 includes a seed layer 1110, a transition layer 1120, a conductive layer 1130, and a conductive layer 1140, in accordance with some embodiments. The seed layer 1110, the transition layer 1120, the conductive layer 1130, and the conductive layer 1140 are sequentially formed, in accordance with some embodiments.

The forming method and the materials of the seed layer 1110, the transition layer 1120, the conductive layer 1130, and the conductive layer 1140 are correspondingly the same as or similar to those of the seed layer 272, the transition layer 274, the conductive layer 276, and the conductive layer 278 of the semiconductor package structure 500 of FIG. 1P, in accordance with some embodiments.

The seed layer 1110 includes a titanium layer (not shown) and a copper layer (not shown), in accordance with some embodiments. In some embodiments, the seed layer 1110 is in direct contact with the conductive bumps 460. The transition layer 1120 is in direct contact with the seed layer 1110 and the conductive layer 1130, in accordance with some embodiments. The transition layer 1120 includes twinned copper and non-twinned copper, in accordance with some embodiments. The transition layer 1120 includes twinned copper grains and non-twinned copper grains, in accordance with some embodiments.

In some embodiments, a twinned copper volume percentage in the transition layer 1120 increases toward the conductive layer 1130. In some embodiments, the twinned copper volume percentage in the transition layer 1120 continuously increases toward the conductive layer 1130. The formation of transition layer 1120 includes performing a pulse electroplating process on the seed layer 1110 to form the transition layer 1120, in accordance with some embodiments.

The conductive layer 1130 is directly formed on the transition layer 1120, in accordance with some embodiments. The conductive layer 1130 is substantially made of twinned copper, in accordance with some embodiments. The conductive layer 1130 includes twinned copper grains, in accordance with some embodiments.

In some embodiments, the average twinned copper volume percentage in the entire conductive layer 1130 ranges from about 95 vol % to about 99.9 vol %. The average twinned copper volume percentage in the conductive layer 1130 may be obtained by using an electron back-scatter diffraction (EBSD) analysis system or another suitable analysis system. The twinned copper includes (111)-oriented twinned copper, in accordance with some embodiments. In some embodiments, a thickness T13 of the conductive layer 1130 is greater than a thickness T14 of the transition layer 1120.

The formation of the conductive layer 1130 includes performing a direct current electroplating process on the transition layer 1120 to form the conductive layer 1130 on the transition layer 1120, in accordance with some embodiments. The formation of the conductive layer 1130 uses an electroplating solution, in accordance with some embodiments. In such embodiments, the electroplating solution may include copper sulfate, methyl sulfonate, and/or chlorine ion. The electroplating solution may further include organic acid (e.g. methyl sulfonate), gelatin, or a mixture thereof, in accordance with some embodiments.

In some embodiments, the formation of the transition layer 1120 and the formation of the conductive layer 1130 use the same electroplating solution. In some embodiments, the formation of the transition layer 1120 and the formation of the conductive layer 1130 are performed in the same plating tank.

As shown in FIG. 7, a conductive layer 1140 is formed over the conductive layer 1130, in accordance with some embodiments. The conductive layer 1130 is in direct contact with the conductive layer 1140 and the transition layer 1120, in accordance with some embodiments.

In some embodiments, an average roughness of a surface 1140a of the conductive layer 1140 is less than an average roughness of a surface 1130a of the conductive layer 1130. The conductive layer 1140 includes copper or another suitable conductive material. The conductive layer 1140 may also referred to as a bright copper layer. The smooth surface 1140a of the conductive layer 1140 has a good light reflectivity. Therefore, the conductive layer 1140 improves photolithography alignment accuracy of photolithography processes performed on the conductive layer 1140.

The conductive layer 1140 is formed using a direct current electroplating process, in accordance with some embodiments. The formation of the conductive layer 1140 uses an electroplating solution that is different from the electroplating solution used in the formation of the conductive layer 1130 and the transition layer 1120, in accordance with some embodiments.

In accordance with some embodiments, semiconductor package structures and methods for forming the same are provided. The methods (for forming the semiconductor package structure) form conductive lines mainly including twinned copper. Since twinned copper has a Young's modulus and a tensile strength greater than that of non-twinned copper, twinned copper may withstand greater stress. Therefore, twinned copper in the conductive lines may prevent the conductive lines from cracking. Therefore, the yield of the conductive lines is improved.

In accordance with some embodiments, a semiconductor package structure is provided. The semiconductor package structure includes a chip structure. The semiconductor package structure includes a first conductive structure over the chip structure. The first conductive structure is electrically connected to the chip structure. The first conductive structure includes a first transition layer over the chip structure; a first conductive layer on the first transition layer; and a second conductive layer over the first conductive layer. The first conductive layer is substantially made of twinned copper. A first average roughness of a first top surface of the second conductive layer is less than a second average roughness of a second top surface of the first conductive layer In accordance with some embodiments, a semiconductor package structure is provided. The semiconductor package structure includes a chip structure. The semiconductor package structure includes a molding layer surrounding the chip structure. The semiconductor package structure includes a conductive via structure passing through the molding layer. The semiconductor package structure includes a redistribution structure over the conductive via structure and the molding layer. The redistribution structure is connected to the conductive via structure. The redistribution structure includes a first transition layer; a first conductive layer over the first transition layer; and a second conductive layer over the first conductive layer. The second conductive layer is substantially made of twinned copper, and an average volume percentage of the twinned copper in the first conductive layer is greater than an average volume percentage of the twinned copper in the second conductive layer. The first conductive layer is substantially made of twinned copper.

In accordance with some embodiments, a semiconductor package structure is provided. The semiconductor package structure includes a chip structure. The semiconductor package structure includes a conductive structure over the chip structure. The conductive structure is electrically connected to the chip structure. The conductive structure includes a transition layer over the chip structure; and a first conductive layer on the transition layer. The transition layer includes twinned copper. The first conductive layer is substantially made of twinned copper, and an average volume percentage of the twinned copper in the first conductive layer is greater than an average volume percentage of the twinned copper in the transition layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a chip structure; and
   a first conductive structure over the chip structure, wherein the first conductive structure is electrically connected to the chip structure and comprises:
   a first transition layer over the chip structure;
   a first conductive layer on the first transition layer, wherein the first conductive layer is substantially made of twinned copper; and
   a second conductive layer over the first conductive layer, wherein a first average roughness of a first top surface of the second conductive layer is less than a second average roughness of a second top surface of the first conductive layer.

2. The semiconductor package structure as claimed in claim 1, wherein the twinned copper in the first conductive layer comprises (111)-oriented twinned copper.

3. The semiconductor package structure as claimed in claim 1, further comprising:
   a first dielectric layer over the chip structure, wherein the first conductive structure is over the first dielectric layer and extends through the first dielectric layer to be electrically connected to the chip structure, and the first dielectric layer is in direct contact with the chip structure and the first conductive structure.

4. The semiconductor package structure as claimed in claim 1, wherein the first conductive structure further comprises:
   a seed layer between the chip structure and the first transition layer, wherein the seed layer is in direct contact with the chip structure and the first transition layer.

5. The semiconductor package structure as claimed in claim 1, further comprising:
   a second conductive structure over and electrically connected to the first conductive structure, wherein the second conductive structure comprises:
   a second transition layer over the first conductive structure, and
   a third conductive layer on the second transition layer, the third conductive layer being substantially made of twinned copper.

6. The semiconductor package structure as claimed in claim 5, wherein:
   the first and second conductive structures are configured as conductive lines; and
   a first average line width of the first conductive structure is less than a second average line width of the second conductive structure, and the second conductive structure is in direct contact with the first conductive structure.

7. The semiconductor package structure as claimed in claim 1, wherein a thickness of the first conductive layer is greater than a thickness of the second conductive layer.

8. The semiconductor package structure as claimed in claim 7, wherein the first conductive layer is in direct contact with the second conductive layer and the first transition layer.

9. The semiconductor package structure as claimed in claim 1, wherein the first transition layer comprises twinned copper, and a twinned-copper volume percentage in the first transition layer increases toward the first conductive layer.

10. The semiconductor package structure as claimed in claim 1, wherein a thickness of the first conductive layer is greater than a thickness of the first transition layer.

11. A semiconductor package structure, comprising:
    a chip structure;
    a molding layer surrounding the chip structure;
    a conductive via structure passing through the molding layer; and
    a redistribution structure over the conductive via structure and the molding layer, wherein the redistribution structure is connected to the conductive via structure and comprises:
    a first transition layer;
    a first conductive layer over the first transition layer, wherein the first conductive layer is substantially made of twinned copper; and
    a second conductive layer over the first conductive layer, wherein the second conductive layer is substantially made of twinned copper, and an average volume percentage of the twinned copper in the first conductive layer is greater than an average volume percentage of the twinned copper in the second conductive layer.

12. The semiconductor package structure as claimed in claim 11, wherein the conductive via structure comprises a second transition layer, and a third conductive layer over the second transition layer, the third conductive layer being substantially made of twinned copper.

13. The semiconductor package structure as claimed in claim 11, wherein the first conductive layer is in direct contact with the first transition layer.

14. The semiconductor package structure as claimed in claim 13, wherein the first conductive layer is in direct contact with the second conductive layer.

15. The semiconductor package structure as claimed in claim 11, further comprising:
    a dielectric layer over and in direct contact with the chip structure and the molding layer, wherein the redistribution structure is over the dielectric layer and extends through the dielectric layer to be electrically connected to the conductive via structure.

16. The semiconductor package structure as claimed in claim 11, wherein the first conductive layer is thicker than the second conductive layer.

17. A semiconductor package structure, comprising:
a chip structure; and
a conductive structure over the chip structure, wherein the conductive structure is electrically connected to the chip structure and comprises:
   a transition layer over the chip structure, wherein the transition layer comprises twinned copper; and
   a first conductive layer on the transition layer, wherein the first conductive layer is substantially made of twinned copper, and an average volume percentage of the twinned copper in the first conductive layer is greater than an average volume percentage of the twinned copper in the transition layer.

18. The semiconductor package structure as claimed in claim 17, wherein the first conductive layer is thicker than the transition layer.

19. The semiconductor package structure as claimed in claim 17, wherein the conductive structure further comprises:
   a seed layer between the chip structure and the transition layer, wherein the seed layer is in direct contact with the chip structure and the transition layer.

20. The semiconductor package structure as claimed in claim 17, wherein the conductive structure further comprises:
   a second conductive layer over the first conductive layer, wherein the second conductive layer is substantially made of twinned copper, and the first conductive layer is thicker than the second conductive layer.

\* \* \* \* \*